United States Patent
Shibuya et al.

(10) Patent No.: US 6,490,010 B1
(45) Date of Patent: Dec. 3, 2002

(54) AFC CIRCUIT, CARRIER RECOVERY CIRCUIT AND RECEIVER DEVICE CAPABLE OF REGENERATING A CARRIER RELIABLY EVEN AT THE TIME OF LOW C/N RATIO

(76) Inventors: Kazuhiko Shibuya, c/o NHK Hosogijutsukenkyusyo, 10-11, Kinuta 1-chome, Setagaya-ku, Tokyo 157-8510 (JP); Junji Kumada, c/o NHK Hosogijutsukenkyusyo, 10-11, Kinuta 1-chome, Setagaya-ku, Tokyo 157-8510 (JP); Yuichi Iwadate, c/o NHK Hosogijutsukenkyusyo, 10-11, Kinuta 1-chome, Setagaya-ku, Tokyo 157-8510 (JP); Hiroyuki Hamazumi, c/o NHK Hosogijutsukenkyusyo, 10-11, Kinuta 1-chome, Setagaya-ku, Tokyo 157-8510 (JP); Toshihiro Nomoto, c/o NHK Hosogijutsukenkyusyo, 10-11, Kinuta 1-chome, Setagaya-ku, Tokyo 157-8510 (JP); Kouichi Takano, c/o NHK Hosogijutsukenkyusyo, 10-11, Kinuta 1-chome, Setagaya-ku, Tokyo 157-8510 (JP); Tomohiro Saito, c/o NHK Hosogijutsukenkyusyo, 10-11, Kinuta 1-chome, Setagaya-ku, Tokyo 157-8510 (JP); Shoji Tanaka, c/o NHK Hosogijutsukenkyusyo, 10-11, Kinuta 1-chome, Setagaya-ku, Tokyo 157-8510 (JP); Fumiaki Minematsu, c/o NHK Hosogijutsukenkyusyo, 10-11, Kinuta 1-chome, Setagaya-ku, Tokyo 157-8510 (JP); Akinori Hashimoto, c/o NHK Hosogijutsukenkyusyo, 10-11, Kinuta 1-chome, Setagaya-ku, Tokyo 157-8510 (JP); Shigeyuki Itoh, c/o NHK Hosogijutsukenkyusyo, 10-11, Kinuta 1-chome, Setagaya-ku, Tokyo 157-8510 (JP); Hajime Matsumura, c/o NHK Hosogijutsukenkyusyo, 10-11, Kinuta 1-chome, Setagaya-ku, Tokyo 157-8510 (JP); Hisakazu Katoh, c/o NHK Hososenta, 2-1, Jinnan 2-chome, Sibuya-ku, Tokyo 150-8001 (JP); Masaru Takechi, c/o NHK Hosogijutsukenkyusyo, 10-11, Kinuta 1-chome, Setagaya-ku, Tokyo 157-8510 (JP)

( * ) Notice: Subject to any disclaimer, the term of this patent is extended or adjusted under 35 U.S.C. 154(b) by 0 days.

(21) Appl. No.: 09/308,263
(22) PCT Filed: Sep. 18, 1998
(86) PCT No.: PCT/JP98/04206
§ 371 (c)(1),
(2), (4) Date: May 14, 1999
(87) PCT Pub. No.: WO99/14914
PCT Pub. Date: Mar. 25, 1999

(30) Foreign Application Priority Data

Sep. 18, 1997 (JP) .............................. 9-253979

(51) Int. Cl.$^7$ ................................. H04N 5/50
(52) U.S. Cl. ...................... 348/735; 375/326
(58) Field of Search ................. 348/638, 639, 348/ 735, 726, 725, 732; 375/326, 344, 325, 323, 327, 322; 325/307, 353, 347, 304, 358, 360; 455/182.2, 192.1, 192.2, 205

(56) References Cited

U.S. PATENT DOCUMENTS

| | | | | |
|---|---|---|---|---|
| 4,338,574 A | * | 7/1982 | Fujita et al. | 331/1 A |
| 5,128,625 A | * | 7/1992 | Yatsuzuka et al. | 328/155 |
| 5,260,975 A | * | 11/1993 | Saito | 375/81 |
| 5,608,764 A | * | 3/1997 | Sugita et al. | 375/344 |
| 5,638,406 A | * | 6/1997 | Sogabe | 375/326 |
| 5,644,606 A | * | 7/1997 | Martinez et al. | 375/376 |
| 5,717,222 A | * | 2/1998 | Mori | 375/326 |
| 5,809,009 A | * | 9/1998 | Matsuoka et al. | 370/206 |

FOREIGN PATENT DOCUMENTS

GB  2300093  * 10/1996  ............. H02L/7/02

* cited by examiner

*Primary Examiner*—Victor R. Kostak
(74) *Attorney, Agent, or Firm*—Olson & Hierl, Ltd.

(57) ABSTRACT

Stabilized carrier recovery is achieved even at the time of a low C/N ratio by measuring the phase of a signal and controlling VCO or NCO (Numerical Controlled Oscillator) using only a period having few constellation points. At this time, false lock phenomenon is avoided as follows. That is, relatively short SYNC modulated by an already-known pattern is entered into a modulation wave, VCO or NCO oscillation frequency is swept in a wide range and sweep is stopped at a frequency in which the SYNC can be received, thereby carrying out coarse control AFC. Further, a period having long to some extent, having few constellation points is provided in the modulation wave and then, a difference between the frequency of a received modulated signal and a local oscillation signal of VCO or NCO is obtained in this period. This frequency difference is analyzed according to the phase differential function method, self-correlation function method or count method, and the VCO or NCO is controlled based on this result of analysis.

10 Claims, 11 Drawing Sheets

AFC CIRCUIT, CARRIER RECOVERY CIRCUIT AND RECEIVER DEVICE CAPABLE OF REGENERATING A CARRIER RELIABLY EVEN AT THE TIME OF LOW C/N RATIO

TECHNICAL FIELD

The present invention relates to an AFC circuit, a carrier recovery circuit and a receiver for use in satellite digital television broadcasting and more particularly to an AFC circuit, a carrier recovery circuit and a receiver for regenerating a carrier even at the time of low C/N ratio.

SUMMARY OF THE INVENTION

For digital transmission through a satellite, hierarchical transmission method capable of data transmission to some extent even at the time of a low C/N ratio by adaptive transmission by time division based on modulation method having different numbers of constellation points by considering a deterioration of the C/N ratio due to rain attenuation or the like has been invented. In such a transmission method, it is very difficult to obtain a reference signal necessary for carrier recovery from a period of modulation wave having many constellation points at the time of low C/N ratio, and therefore, a carrier recovery method which is an ordinary carrier recovery method for continuously regenerating the carrier, cannot be used.

Accordingly, an object of the present invention is to achieve carrier recovery by disposing periodically a modulated signal period with few constellation points which is modulated by, for example, BPSK modulation method or QPSK modulation method and from which a reference carrier signal having a considerable CN rate can be obtained, and fetching out phase/frequency error information periodically. Further, because, according to a method for observing a phase error signal periodically, with a frequency of a predetermined period, the same phase error signal is obtained, so-called false lock phenomenon in which the frequency is apparently synchronized with a different frequency from its proper carrier frequency occurs. To avoid this phenomenon, a modulated signal with few constellation points which is modulated by, for example, BPSK modulation method or QPSK modulation method is set at a predetermined interval and in the pseudo synchronizing state, a frequency of a difference from the proper carrier frequency is observed by using such a fact that the reception signal phase is rotated in a predetermined direction so as to control the VCO (Voltage Controlled Oscillator) thereby making it possible to synchronize with the proper frequency. In the modulation period having few constellation points, detection of the pseudo synchronizing state and synchronization with a desired frequency are enabled using a statistical characteristic of an observed signal.

BACKGROUND ART

In a conventional transmission method of transmitting a modulated signal having many constellation points continuously or a method in which the number of constellation points is changed by time division system, if carrier recovery is carried out continuously, when the C/N ratio drops, a stabilized carrier recovery signal cannot be obtained in a modulation period having many constellation points. For this reason, even if a modulated signal having few constellation points exists, stable demodulation is disabled.

Further, in a method for carrying out carrier recovery periodically using only a period having a few constellation points for such a modulated signal, there is a problem that false lock occurs by observing the phase periodically. Therefore, a wide capture range cannot be achieved. Thus, because a very high frequency stabilization accuracy is demanded in the transmission system containing the frequency conversion portion, the receiver device becomes very expensive.

For the reason, according to the method for transmitting modulated signals having different numbers of constellation points in time division system, if the conventional carrier recovery system is utilized, the carrier recovery is disabled when the C/N ratio is low.

Then, although a method for controlling the VCO or NCO (Numerical Controlled Oscillator) can be considered by measuring the phase with only a period having a few constellation points, there is a problem that a wide capture range cannot be achieved because of false lock phenomenon caused by observing the phase periodically.

The present invention has been achieved in viewpoints of the above problems and therefore it is an object of the invention to provide an AFC circuit capable of regenerating a carrier signal synchronous with the inputted signal in terms of the frequency while preventing an occurrence of false lock even when a reference signal period or a modulated signal period having a few constellation points which can be used for carrier recovery, contained in an input signal, is short or even when noise is mixed in the inputted signal.

Another object of the invention is to provide a carrier recovery circuit capable of regenerating the carrier signal stably in a wide capture range by transmitting modulations signal having different numbers of constellation points by time-division system and carrying out carrier synchronization using phase and frequency error information obtained periodically even if the C/N ratio is low when a modulated signal is received and regenerated.

Still another object of the invention is to provide a receiver device capable of regenerating information contained in digitally modulated signal by carrying out carrier synchronization using phase and frequency error information obtained periodically and regenerating the carrier signal stably in a wide capture range even if the C/N ratio is low when digitally modulated signal provided with a reference signal period or digitally modulated signal period having a few constellation points to be useful for carrier recovery at a predetermined time interval is received and regenerated.

DISCLOSURE OF INVENTION

To achieve the above object, the AFC circuit for detecting a frequency difference between two inputted signals and zeroing said frequency difference between the inputted signals according to the detection result, comprises: a frequency difference detecting portion for detecting a phase difference between the inputted signals and generating a frequency correction signal according to the phase difference or a time differential value of the phase difference; and a frequency difference correcting portion for rotating the phase of the inputted signal according to the frequency correction signal outputted from the frequency difference detecting portion so as to zero the frequency difference between the inputted signals.

In the AFC circuit for detecting a frequency difference between two inputted signals and zeroing the frequency difference between the inputted signals according to the detection result, a frequency difference detecting portion detects a phase difference between the inputted signals and generates a frequency correction signal according to the phase difference or a time differential value of the phase difference and a frequency difference correcting portion rotates phase of the inputted signals according to the frequency correction signal outputted from the frequency difference detecting portion so as to zero the frequency difference between the inputted signals. As a result, even when the reference signal period modulated signal period having few constellation points which is usable for regenerating a carrier contained in the inputted signals is short or even when noise is mixed in the inputted signals, a carrier signal synchronous with the inputted signals is regenerated while preventing an occurrence of false lock.

Another feature of the invention is an AFC circuit for detecting a frequency difference between two inputted signals and zeroing said frequency difference between the inputted signals according to the detection result, the AFC circuit comprising: a correlation computing portion for detecting a phase difference between the inputted signals and computing an autocorrelation coefficient of the phase difference; and a frequency difference correcting portion for counting a number of peaks in a waveform of the autocorrelation coefficient obtained by the correlation computing portion and rotating phase of the inputted signals according to the count result so as to zero the frequency difference between the inputted signals.

In the AFC circuit in the preceding paragraph for detecting a frequency difference between two inputted signals and zeroing the frequency difference between the inputted signals according to the detection result, a correlation computing portion detects a phase difference between the inputted signals and computes an autocorrelation coefficient of the phase difference and a frequency difference correcting portion counts the number of peaks in a waveform of the autocorrelation coefficient obtained by the correlation computing portion and rotates phase of the inputted signals according to the count result so as to zero the frequency difference between the inputted signals. As a result, even when the reference signal period or modulated signal period having few constellation points which is usable for regenerating a carrier contained in the inputted signal is short or even when noise is mixed in the inputted signal, a carrier signal synchronous with the inputted signal is regenerated while preventing an occurrence of false lock.

Another feature of the invention is an AFC circuit for detecting a frequency difference between two inputted signals and zeroing said frequency difference between the inputted signals according to the detection result, the AFC circuit comprising: a correlation computing portion for detecting a phase difference between the inputted signals and computing an autocorrelation coefficient of a waveform varying in time of the phase difference; and a frequency difference correcting portion for obtaining an average period of a periodic waveform appearing in a waveform of the autocorrelation coefficient obtained by the correlation computing portion and rotating a phase between the inputted signals according to the average period so as to zero the frequency difference of the inputted signals.

In the last described AFC circuit for detecting a frequency difference between two inputted signals and zeroing the frequency difference between the inputted signals according to the detection result, a correlation computing portion detects a phase difference between the inputted signals and computes an autocorrelation coefficient of a waveform varying in time of the phase difference and a frequency difference correcting portion obtains an average period of periodic waveform appearing in a waveform in the autocorrelation coefficient obtained by the correlation computing portion and rotates a phase between the inputted signals according to the average period so as to zero the frequency difference of the inputted signals. As a result, even when the reference signal period or modulated signal period having few constellation points which is usable for regenerating a carrier contained in the inputted signal is short or even when noise is mixed in the inputted signal, a carrier signal synchronous with the inputted signal is regenerated while preventing an occurrence of false lock.

A further feature of the present invention is an AFC circuit for detecting a frequency difference between two inputted signals and zeroing said frequency difference between the inputted signals according to the detection result, the AFC circuit comprising: a region determining portion for detecting a phase difference between the inputted signals and determining which region each signal point is included in according to the phase difference; and a frequency difference correcting portion for counting a determination result of the region determining portion for each phase and for each determining region rotated at a rotation speed corresponding to a set frequency, and rotating phase of the inputted signals according to the count result so as to zero the frequency difference between the inputted signals.

In the last described AFC circuit for detecting a frequency difference between two inputted signals and zeroing the frequency difference between the inputted signals according to the detection result, a region determining portion detects a phase difference between the inputted signals and determines which region each signal point is included in according to the phase difference and a frequency difference correcting portion counts a determination result of the region determining portion for each phase and for each determining region rotated at a rotation speed corresponding to a set frequency and rotates phase of the inputted signals according to the count result so as to zero the frequency difference between the inputted signals. As a result, even when the synchronization period for the inputted signal is short or even when noise is mixed in the inputted signal, a carrier signal synchronous with the inputted signal is regenerated while preventing an occurrence of false lock.

A further feature of the invention is a carrier recovery circuit for regenerating a carrier signal from an I baseband signal and a Q baseband signal obtained by quadrature-demodulating a reception signal, the circuit comprising: a frequency difference detecting portion for detecting a phase difference between the regenerated carrier signal and the reception signal from the I axis side signal and the Q axis side signal obtained by quadrature-demodulating the reception signal by the regenerated carrier signal, and generating a frequency correction signal according to the phase difference or a differential value of the phase difference; and a frequency difference correcting portion for controlling a frequency of the regeneration carrier signal according to the frequency correction signal outputted from the frequency difference detecting portion so as to zero a frequency difference between the reception signal and the regeneration carrier signal.

In the carrier recovery circuit for regenerating a carrier signal from an I baseband signal and a Q baseband signal obtained by quadrature-demodulating a reception signal, a frequency difference detecting portion detects a phase difference between the regenerated carrier signal and the reception signal from the I axis side signal and the Q axis side signal obtained by quadrature-demodulating the reception signal by the regenerated carrier signal and generates a frequency correction signal according to the phase difference or a differential value of the phase difference and a frequency difference correcting portion controls a frequency of the regenerated carrier signal according to the frequency correction signal outputted from the frequency difference detecting portion so as to zero a frequency difference between the reception signal and the regenerated carrier signal. As a result, upon transmitting a modulated signal having different numbers of constellation points by time division system and receiving the signal, even when the C/N ratio is low, the carrier synchronization is carried out using information of the phase and frequency obtained periodically, so that the carrier signal is regenerated stably in a wide capture range.

Yet another feature of the invention is a carrier recovery circuit regenerating a carrier signal from an I baseband signal and a Q baseband signal obtained by quadrature-demodulating a reception signal, the circuit comprising: a correlation computing portion for detecting a phase difference between the regenerated carrier signal and the reception signal from the I axis side signal and the Q axis side signal obtained by quadrature-demodulating the reception signal by the regenerated carrier signal so as to compute autocorrelation coefficients of the phase difference; and a frequency difference correcting portion for counting peaks of the waveform of the autocorrelation coefficient waveform obtained by the correlation computing portion and controlling a frequency of the regenerated carrier signal according to the count result so as to zero the frequency difference between the reception signal and the regenerated carrier signal.

In the last described carrier recovery circuit for regenerating a carrier signal from an I baseband signal and a Q baseband signal obtained by quadrature-demodulating a reception signal, a correlation computing portion detects a phase difference between the regenerated carrier signal and the reception signal from the I axis side signal and the Q axis side signal obtained by quadrature-demodulating the reception signal by the regenerated carrier signal so as to compute autocorrelation coefficients of the phase difference and a frequency difference correcting portion counts peaks of a waveform of the autocorrelation coefficient obtained by the correlation computing portion and controls frequency of the regeneration carrier signal according to the result so as to zero the frequency difference between the reception signal and the regenerated carrier signal. As a result, upon transmitting a modulated signal having different numbers of constellation points by time division system and receiving the signal, even when the C/N ratio is low, the carrier synchronization is carried out using information of the phase and frequency obtained periodically, so that the carrier signal is regenerated stably in a wide capture range.

A further feature of the invention is a carrier recovery circuit for regenerating a carrier signal from an I baseband signal and a Q baseband signal obtained by quadrature-demodulating a reception signal, the circuit comprising: a correlation computing portion for detecting a phase difference between the regenerated carrier signal and the reception signal from the I baseband signal and the Q baseband signal obtained by quadrature-demodulating the reception signal by the regenerated carrier signal so as to compute autocorrelation coefficients of the phase difference; and a frequency difference correcting portion for obtaining an average period of a periodic waveform appearing in a waveform of the autocorrelation coefficient obtained by the correlation computing portion, and controlling a frequency of the regenerated carrier signal based on the average period so as to zero the frequency difference between the reception signal and the regenerated carrier signal.

In the last described carrier recovery circuit for regenerating a carrier signal from an I baseband signal and a Q baseband signal obtained by quadrature-demodulating a reception signal, a correlation computing portion detects a phase difference between the regenerated carrier signal and the reception signal from the I baseband signal and the Q baseband signal obtained by quadrature-demodulating the reception signal by the regenerated carrier signal so as to compute the autocorrelation coefficients of the phase difference. A frequency difference correcting portion obtains an average period of a periodic waveform appearing in a waveform of the autocorrelation coefficient obtained by the correlation computing portion and controls frequency of the regenerated carrier signal based on the average period so as to zero the frequency difference between the reception signal and the regenerated carrier signal. As a result, upon transmitting a modulated signal having different numbers of constellation points by time division system and receiving the signal, even when the C/N ratio is low, the carrier synchronization is carried out using information of the phase and frequency obtained periodically, so that the carrier signal is regenerated stably in a wide capture range.

Another feature of the invention is a carrier recovery circuit for regenerating a carrier signal from an I baseband signal and a Q baseband signal obtained by quadrature-demodulating a reception signal, the circuit comprising: a region determining portion for detecting a phase difference between the regenerated carrier signal and the reception signal from the I axis side signal and the Q axis side signal obtained by quadrature-demodulating the reception signal by the regenerated carrier signal, and determining which region of a phase plane each signal point is included in based on the phase difference; and a frequency difference/phase difference correcting portion for counting a determination result of the region determining portion for each phase and for each determination region rotated at a rotation speed corresponding to a set frequency, and controlling frequency and phase of the regenerated carrier signal based on the count result so as to zero a frequency difference and the phase difference between the reception signal and the regenerated carrier signal.

In the last described carrier recovery circuit for regenerating a carrier signal from an I baseband signal and a Q baseband signal obtained by quadrature-demodulating a reception signal, a region determining portion detects a phase difference between the regenerated carrier signal and the reception signal from the I axis side signal and the Q axis side signal obtained by quadrature-demodulating the reception signal by the regenerated carrier signal and determine which region of a phase plane each signal point is included in based on the phase difference and a frequency difference correcting portion counts a determination result of the region determining portion for each phase and for each determination region rotated at a rotation speed corresponding to a set frequency and controls frequency and phase of the regenerated carrier signal based on the count result so as to zero the frequency difference and phase difference between the reception signal and regenerated carrier signal. As a result, upon transmitting a modulated signal having different numbers of constellation points by time division system and receiving the signal, even when the C/N ratio is low, the carrier synchronization is carried out using information of the phase and frequency obtained periodically, so that the carrier signal is regenerated stably in a wide capture range.

Another feature of the invention is a receiver device for regenerating a carrier signal based on the I baseband signal and the Q baseband signal obtained by quadrature-demodulating a reception signal, and decoding the I baseband signal and the Q baseband signal so as to regenerate information, said receiver device further receiving a digitally modulated signal provided with a reference signal period or a digitally modulated signal period having few constellation points to be used for carrier recovery at a predetermined time interval; and establishing carrier synchronization using information about phase error and frequency error obtained in the reference signal period or in the digitally modulated signal period having constellation points.

In the last described receiver device for regenerating a carrier signal based on the I baseband signal and the Q baseband signal obtained by quadrature-demodulating a reception signal, and decoding the I baseband signal and the Q baseband signal so as to regenerate information, the receiver device further receives a digitally modulated signal provided with a reference signal period or a digitally modulated signal period having few constellation points to be used for carrier recovery at a predetermined time interval and establishes carrier synchronization using information about phase error and frequency error obtained in the reference signal period of the digitally modulated signal or the digitally modulated signal period. As a result, upon receiving a digitally modulated signal provided with a reference signal period or a digitally modulated signal period having a few constellation points useful for carrier recovery at a predetermined time interval, even when the C/N ratio is low, carrier synchronization is carried out using phase and frequency error information obtained periodically and then a carrier signal is regenerated stably in a wide capture range so as to regenerate information contained in digitally modulated signal.

The receiver device for regenerating a carrier signal based on the I baseband signal and the Q baseband signal obtained by quadrature-demodulating a reception signal, and decoding the I baseband signal and the Q baseband signal so as to regenerate information, further receiving a digitally modulated signal provided with a reference signal period or a digitally modulated signal period having few constellation points to be used for carrier recovery at a predetermined time interval; and detecting a difference between a regeneration carrier frequency and a carrier frequency of the reception signal obtained in a reference signal period or in a digitally modulated signal period having few constellation points so as to achieve at least one of AFC function or false lock preventing function based on the detection result.

In the receiver device for regenerating a carrier signal based on the I baseband signal and the Q baseband signal obtained by quadrature-demodulating a reception signal, and decoding the I baseband signal and the Q baseband signal so as to regenerate information, the receiver device further receives a digitally modulated signal provided with a reference signal period or a digitally modulated signal period having few constellation points to be used for carrier recovery at a predetermined time interval and detecting a difference between the regenerated carrier frequency and the carrier frequency of the reception signal obtained in a reference signal period of the digitally modulated signal or a digitally modulated signal period so as to achieve at least one of AFC function or false lock preventing function based on the detection result. As a result, upon receiving a digitally modulated signal provided with a reference signal period or with a digitally modulated signal period having a few constellation points useful for carrier recovery at a predetermined time interval, even when the C/N ratio is low, carrier synchronization is carried out using phase and frequency error information obtained periodically and then a carrier signal is regenerated stably in a wide capture range so as to regenerate information contained in digitally modulated signal.

The receiver device last described includes a regeneration carrier frequency controlled according to detuning frequency information obtained by time differential value or a primary inclination of a change of a phase obtained by observing a phase variation in a reference signal period of a reception signal or in a modulated signal period having few constellation points, under a state of frequency asynchronization.

The regeneration carrier frequency is controlled according to detuning frequency information obtained by time differential value or a primary inclination of a change of a phase obtained by observing a phase variation in a reference signal period of a reception signal or in a modulated signal period having few constellation points, under a state of frequency asynchronization. As a result, upon receiving a digitally modulated signal provided with a reference signal period or a digitally modulated signal period having a few constellation points useful for carrier recovery at a predetermined time interval, even when the C/N ratio is low, carrier synchronization is carried out using phase and frequency error information obtained periodically and then a carrier signal is regenerated stably in a wide capture range so as to regenerate information contained in digitally modulated signal.

In the receiver device of the present invention a detuning frequency is estimated based on periodicity of an autocorrelation coefficient waveform in a phase variation curve obtained by observing a phase variation in a reference signal period of a reception signal or in a modulated signal period having few constellation points and then a regeneration carrier frequency is controlled based on detuning frequency information obtained by the estimation operation, under a state of frequency asynchronization.

In the receiver device a detuning frequency is estimated based on periodicity of an autocorrelation coefficient waveform in a phase variation curve obtained by observing a phase variation in a reference signal period of a reception signal or a modulated signal period having few constellation points and then a regeneration carrier frequency is controlled based on detuning frequency information obtained by the estimation operation. As a result, upon receiving a digitally modulated signal provided with a reference signal period or a digitally modulated signal period having a few constellation points useful for carrier recovery at a predetermined time interval, even when the C/N ratio is low, carrier synchronization is carried out using phase and frequency error information obtained periodically and then a carrier signal is regenerated stably in a wide capture range so as to regenerate information contained in digitally modulated signal.

In the receiver device the regeneration carrier frequency is set at a low frequency preliminarily so as to provide a frequency of a waveform or a number of correlation peaks appearing in the autocorrelation coefficient waveform relative to a desired frequency with an offset, thereby making it possible to estimate a detuning frequency lower than the desired frequency.

Further, in the receiver device, the regeneration carrier frequency is set at a low frequency preliminarily so as to provide a frequency of a waveform or the number of correlation peaks appearing in an autocorrelation coefficient waveform relative to a desired frequency with an offset, thereby making it possible to estimate a detuning frequency lower than a desired frequency. As a result, upon receiving a digitally modulated signal provided with a reference signal period or a digitally modulated signal period having a few constellation points useful for carrier recovery at a predetermined time interval, even when the C/N ratio is low, carrier synchronization is carried out using phase and frequency error information obtained periodically and then a carrier signal is regenerated stably in a wide capture range so as to regenerate information contained in digitally modulated signal.

In accord with the present invention, the receiver device is a receiver device wherein whether or not carrier synchronization is established is detected based on a statistical characteristic of phase points of a signal in a modulation period having few constellation points and oscillation frequency sweep of a local oscillator for use for frequency conversion is stopped based on the detection result.

In the receiver device of the preceding paragraph whether or not carrier synchronization is established is detected based on a statistical characteristic of phase point of a signal in a modulation period having few constellation points and oscillation frequency sweep of a local oscillator for use for frequency conversion is stopped based on the detection result. As a result, upon receiving a digitally modulated signal provided with a reference signal period or a digitally modulated signal period having a few constellation points useful for carrier recovery at a predetermined time interval, even when the C/N ratio is low, carrier synchronization is carried out using phase and frequency error information obtained periodically and then a carrier signal is regenerated stably in a wide capture range so as to regenerate information contained in digitally modulated signal.

The receiver device of the present invention is a receiver device for regenerating a carrier signal based on the I baseband signal and the Q baseband signal obtained by quadrature-demodulating a reception signal, and decoding the I baseband signal and the Q baseband signal so as to regenerate information, said receiver device further including a carrier recovery circuit comprising: a receiving portion for receiving a digitally modulated signal provided with a reference signal period or with a digital modulation period having few constellation points to be used for carrier recovery at a predetermined time interval so as to obtain the reception signal; a region determining portion for detecting a phase difference between the regenerated carrier signal and the reception signal from the I axis side signal and the Q axis side signal obtained by quadrature-demodulating the reception signal by the regenerated carrier signal, and determining which region of a phase plane each signal point is included in based on the phase difference; and a frequency difference/phase difference correcting portion for counting a determination result of the region determining portion for each phase and for each determination region rotated at a rotation speed corresponding to a set frequency, and controlling frequency and phase of the regenerated carrier signal based on the count result so as to zero a frequency difference and the phase difference between the reception signal and the regenerated carrier signal, whereby at least one of AFC function or false lock preventing function being achieved.

In the receiver device for regenerating a carrier signal based on the I baseband signal and the Q baseband signal obtained by quadrature-demodulating a reception signal, and decoding the I baseband signal and the Q baseband signal so as to regenerate information, the receiver device further includes a carrier recovery circuit comprising a receiving portion for receiving a digitally modulated signal provided with a reference signal period or with a digital modulation period having few constellation points to be used for carrier recovery at a predetermined time interval, a region determining portion for detecting a phase difference between the regenerated carrier signal and the reception signal from the I axis side signal and the Q axis side signal obtained by quadrature-demodulating the reception signal by the regenerated carrier signal and determining which region of a phase plane each signal point is included in based on the phase difference, a frequency difference/phase difference correcting portion for counting a determination result of the region determining portion for each phase and for each determination region rotated at a rotation speed corresponding to a set frequency, and controlling frequency and phase of the regeneration carrier signal based on the count result so as to zero the frequency difference and phase difference between the reception signal and regenerated carrier signal, whereby at least one of AFC function or false lock preventing function being achieved. As a result, upon receiving a digitally modulated signal provided with a reference signal period or a digitally modulated signal period having a few constellation points useful for carrier recovery at a predetermined time interval, even when the C/N ratio is low, carrier synchronization is carried out using phase and frequency error information obtained periodically and then a carrier signal is regenerated stably in a wide capture range so as to regenerate information contained in digitally modulated signal.

BEST MODE FOR CARRYING OUT THE INVENTION

Basic Description of the Invention

Prior to a detailed description of an AFC circuit, a carrier recovery circuit and a receiver device of the present invention, first of all, the basic principle of the AFC circuit, carrier recovery circuit and receiver unit of the present invention will be described.

Generally, if a conventional carrier recovery method is used as a transmission scheme for transmitting modulated signals each having different numbers of constellation points in time division multiplexing scheme, carrier recovery is difficult at the time of a low C/N ratio. Therefore, according to the present invention, carrier recovery is carried out as described below.

That is, in an AFC circuit, carrier recovery circuit and receiver unit of the present invention, the phase of a signal is measured using only a period containing a small quantity of constellation points and VCO or NCO (Numerical Controlled Oscillator) is controlled so as to carry out stable carrier recovery even at the time of a low C/N ratio. However, because in this case, the phase difference between the received modulated signal and regenerated carrier signal is measured periodically, there is a possibility that false lock phenomenon occurs, so that the wide capture range cannot be realized.

Thus, a SYNC with relatively short period, modulated by an already-known pattern, is assigned into the modulation wave and the oscillation frequency of the VCO or NCO is swept in a wide range, for example, 2 MHz range. The sweeping is stopped at a frequency in which the SYNC can be received and coarse control AFC is carried out. A period containing a small quantity of the constellation points (for example, BPSK signal interval) and having some length is provided in the modulation wave. A difference (difference of frequency) between a frequency of the received modulated signal and a frequency of VCO or NCO local oscillation signal is obtained in this period and then the frequency difference is analyzed according to phase differential function method, self-relative function method or count type method. By controlling the VCO or NCO based on this result of analysis, an AFC function having a wide capture range is realized and even at the time of low C/N ratio, occurrence of the false lock phenomenon is suppressed to realize the wide frequency capture range so as to regenerate an accurate carrier signal.

Embodiments for Carrying Out the Invention

Figure 1:
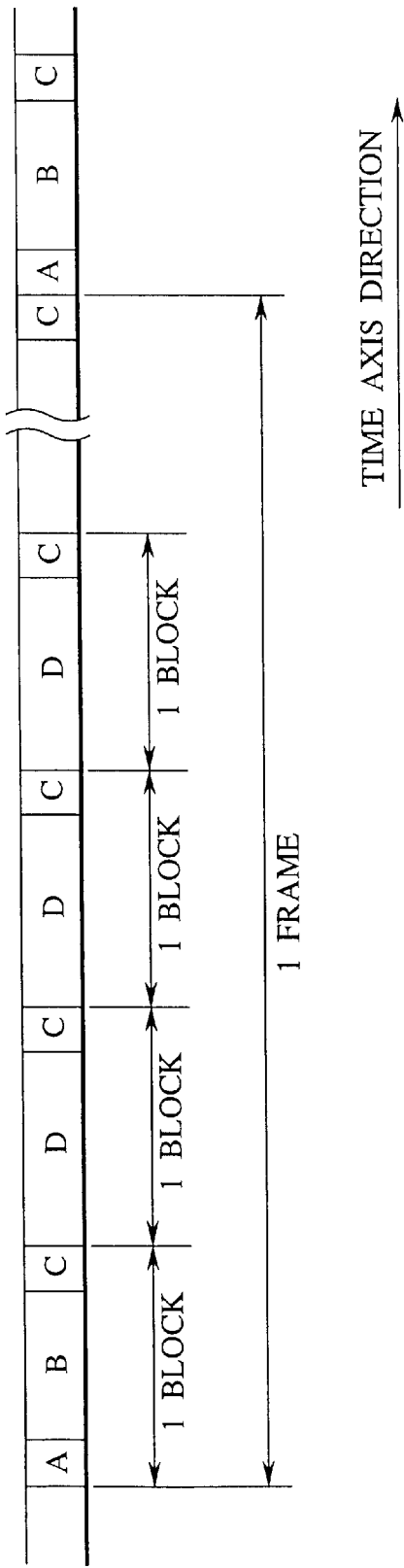
FIG. 1 is a schematic diagram showing an example of format of digital signal for use in an embodiment of an AFC circuit, a carrier recovery circuit and a reciever device of the present invention.

FIG. 1 is a schematic diagram showing an example of format for a digital transmission signal for use in an embodiment of the AFC circuit, carrier recovery circuit and receiver device of the present invention which use the above mentioned basic principle.

In the digital transmission signal shown in this Figure, a single frame is composed of a plurality of blocks, each of which comprises a signal D which is multi-valued signal period and a signal C which is BPSK signal period to be used for carrier phase synchronization, except its head block.

Assuming that the quantity of symbols in a single block is, for example, 196 symbols, in a first block of those blocks, for example, 20 symbols at the head portion are SYNC (synchronous signal) subjected to BPSK modulation by UW (unique word) and 176 (196−20 =176) symbols following this SYNC are information to be transmitted which is subjected to BPSK modulation.

Further, in each block of second and following blocks, for example, up to 192 symbols from a first symbol is information which should be transmitted and subjected to QPSK modulation or 8PSK modulation and the last four symbols are information which should be transmitted and subjected to BPSK modulation for phase synchronization.

Figure 2:
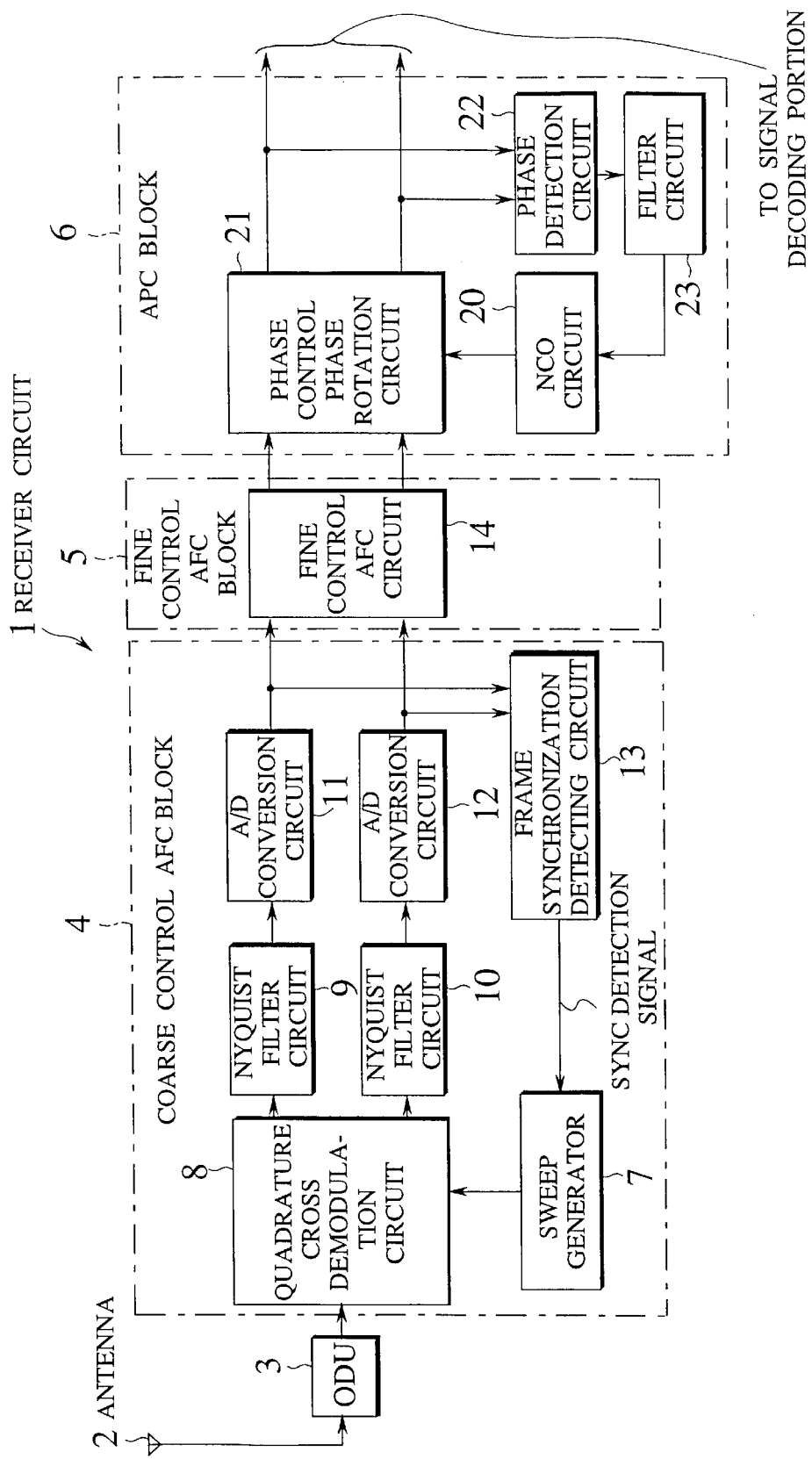
FIG. 2 is a block diagram showing an example of a reciever circuit for use in an embodiment of the AFC circuit, carrier recovery circuit and receiver device of the present invention.

FIG. 2 is a block diagram showing an example of a receiver circuit for use in an embodiment of the AFC circuit, carrier recovery circuit and receiver device of the present invention for receiving the aforementioned digital transmission signal.

A receiver circuit 1 shown in this diagram comprises an antenna 2 for receiving a digital transmission signal of the format shown in FIG. 1, ODU 3 for converting the digitally modulated signal received by this antenna 2 in terms of frequency so as to generate an IF signal, a coarse control AFC block 4 which quadrature-demodulates the IF signal outputted from the ODU 3 so as to generate in-phase axis (hereinafter referred to as I axis) side baseband signal and an quadrature axis (hereinafter referred to as Q axis) side baseband signal and sweeps from a low frequency side in, for example, 2 MHz range so as to detect a first block SYNC contained in the I baseband signal and Q baseband signal, a fine control AFC block which detects a detuning frequency depending on changes of phase observed in a period of the first block SYNC and subsequent 176 symbol BPSK signal contained in the I baseband signal and Q baseband signal to be outputted from this coarse control AFC block 4 so as to regenerate a fine controlled carrier signal, and an APC block 6 for detecting a fine deviation of the frequency and phase error of the I baseband signal and Q baseband signal using the BPSK signal period of each block of the I baseband signal and Q baseband signal outputted from this fine control AFC block 5.

When a digital transmission signal is received by the antenna 2 and the IF signal is outputted from the ODU 3, the coarse control AFC block 4 quadrature-demodulates the IF signal so as to generate the I baseband signal and Q baseband signal. To detect SYNC of the first block contained in the aforementioned I baseband signal and Q baseband signal, local oscillation frequency sweep is carried out from a low frequency side, in an range of, for example, 2 MHz so as to regenerate coarsely controlled carrier signal of the IF signal. At the same time, a detuning frequency is detected according to the SYNC of the first block and subsequent 176 symbol BPSK signal contained in the aforementioned I baseband signal and Q baseband signal by the fine control AFC block 5 so as to regenerate fine controlled carrier signal of the I baseband signal and Q baseband signal. Then, according to the BPSK signal of each block of the I baseband signal and Q baseband signal outputted from the fine control AFC block 5, the APC block 6 adjusts the phase of the regenerated carrier signal to control the phases of the I baseband signal and Q baseband signal. Then, the I baseband signal and Q baseband signal obtained thereby having no deviation in frequency and phase are supplied to a signal decoding portion (not shown).

The coarse control AFC block 4 comprises a sweep generator circuit 7 which contains a variable frequency oscillator such as VCO or NCO and if no SYNC detection signal is inputted, generates a local oscillation signal while sweeping the VCO or NCO oscillation frequency in a range of, for example, 2 MHz from a low frequency side and which when the SYNC detection signal is inputted, stops the sweep, a quadrature demodulation circuit 8 which quadrature-demodulates the IF signal outputted from the ODU 3 using the local oscillation signal outputted from the sweep generator 7 so as to generate the I baseband signal and Q baseband signal, a Nyquist filter circuit 9 for carrying out image removal and waveform shaping by providing Nyquist characteristic to the I baseband signal outputted from the quadrature demodulation circuit 8, an A/D conversion circuit 11 for A/D conversion of the I baseband signal outputted from the Nyquist filter circuit 9 so as to generate a digitized I baseband signal, a Nyquist filter circuit 10 for carrying out image removal and waveform shaping by supplying Nyquist characteristic to the Q baseband signal outputted from the quadrature demodulation circuit 8, an A/D conversion circuit 12 for A/D conversion of the Q baseband signal outputted from the Nyquist filter circuit 10 so as to generate digitized Q baseband signal, and a frame synchronization detecting circuit 13 which compares data contained in the I baseband signal and Q baseband signal outputted from the A/D conversion circuits 11, 12 with preliminarily registered unique word (same unique word as unique word for use in SYNC of digital transmission signal) and when data coinciding with the unique word is detected, generates SYNC detection signal indicating that the SYNC of the first block has been detected and supplies this to the sweep generator 7.

In asynchronous state in which the carrier of the digital transmission signal is not regenerated, like just after the power of the receiver circuit 1 is turned on, the oscillation frequency is swept from a low frequency side in a range of, for example, 2 MHz and according to the local oscillation signal whose frequency is swept, the IF signal outputted from the ODU 3 is quadrature-demodulated so as to generate the I baseband signal and Q baseband signal. Then, by providing the I baseband signal and Q baseband signal with the Nyquist characteristic, image removable and waveform shaping are carried out. After that, those signals are digitized and supplied to the fine control AFC block 5. Further, in parallel to this operation, when data obtained from the I baseband signal and Q baseband signal digitized coincides with unique word, the SYNC detection signal indicating that the SYNC in the top of each frame has been detected is generated and then the oscillation frequency at this time is fixed. Using the local oscillation signal of this oscillation frequency as coarsely controlled carrier signal, the IF signal quadrature demodulation operation, Nyquist filter characteristic providing operation and A/D conversion operation are continued. Then, the digitized I baseband signal and Q baseband signal obtained thereby are supplied to the fine control AFC block 5.

At this time, because in the digital transmission signal received by the receiver circuit 1, the SYNC is BPSK-modulated according to an already-known pattern (unique word), the SYNC can be detected even at the time of low C/N ratio within a frequency error of some extent, even if carrier synchronization is not established. Then, the carrier synchronization can be established within the frequency error of some extent with this SYNC detection as a reference.

The fine control AFC block 5 contains a fine control AFC circuit 14 for carrying out fine adjustment of the frequencies of the I baseband signal and Q baseband signal according to the digitized I baseband signal and Q baseband signal outputted from the coarse control AFC block 4. A detuning frequency is detected from the SYNC of the first block and subsequent 176 symbol BPSK signal contained in the I baseband signal and Q baseband signal outputted from the coarse control AFC block 4. Then, the frequency of the I baseband signal and the frequency of the Q baseband signal are adjusted finely while the fine adjustment carrier signals of the I axis aide baseband signal and Q baseband signal are regenerated and then supplied to the APC block 6 in a state in which the frequency deviation is reduced to almost zero.

Figure 3:
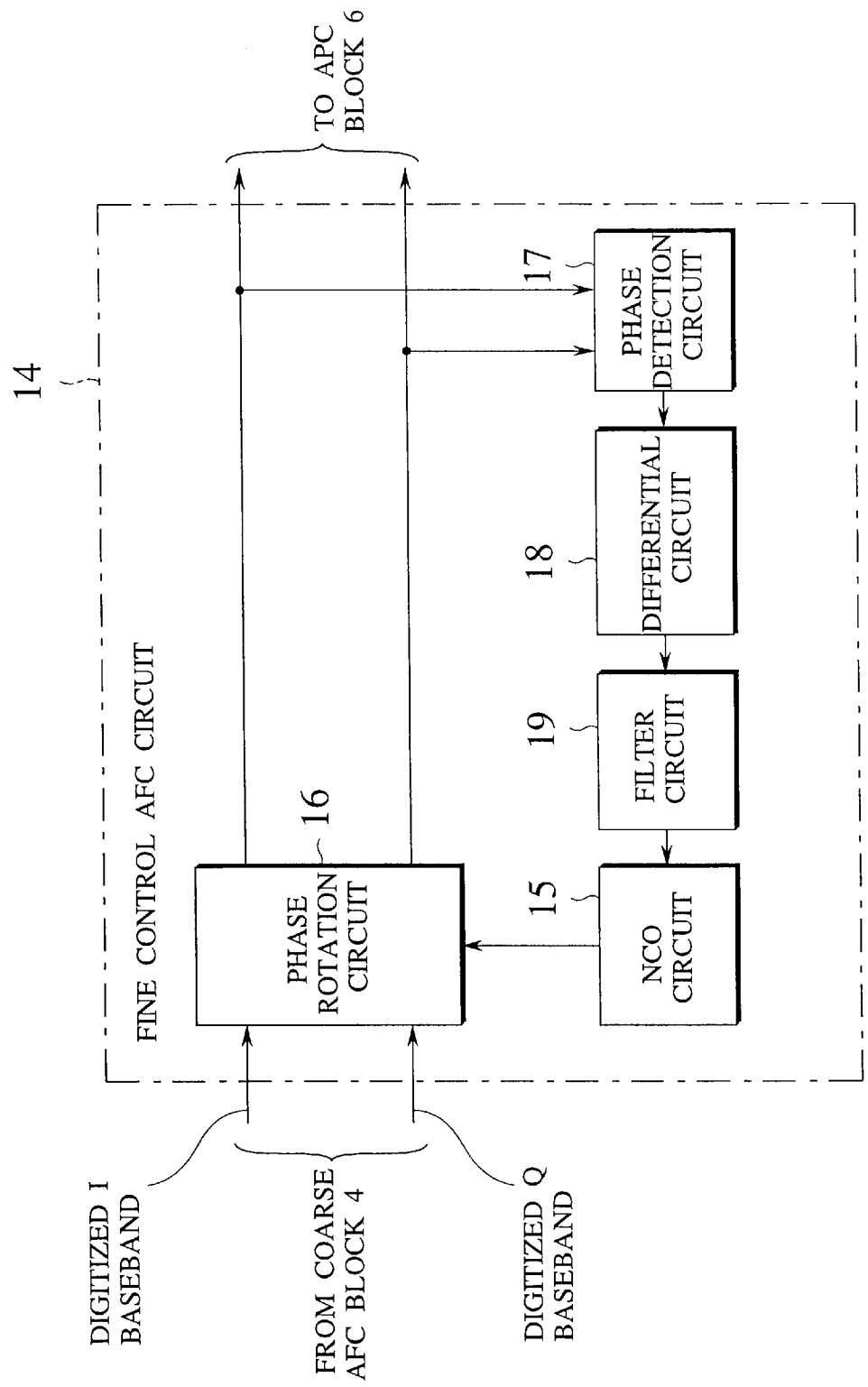
FIG. 3 is a block diagram showing an example of a concrete structure of a fine control AFC circuit shown in FIG. 1.

In this case, as shown in FIG. 3, the fine control AFC circuit 14 comprises an NCO circuit 15 which changes and fixes the oscillation frequency depending on an inputted frequency difference signal, a phase rotation circuit 16 for carrying out complex frequency conversion by rotating the phase of the digitized I baseband signal and Q baseband signal outputted from the coarse control AFC block 4 according to the local oscillation signal outputted from the NCO circuit 15, a phase detection circuit 17 which computes arc tangent of the amplitude of the Q baseband signal divided by amplitude of the I baseband signal outputted from this phase rotation circuit 16 so as to generate a phase difference signal, a differential circuit 18 for generating a frequency difference signal by differentiating a phase difference signal outputted from this phase detecting circuit 17, and a filter circuit 19 which removes noise and unnecessary high frequency components contained in the frequency difference signal outputted from this differential circuit 18 and then supplies the signal to the NCO circuit 15 thereby controlling the frequency of the local oscillation signal outputted from the NCO circuit 15.

Then, first of all, the local oscillation signal is used as the fine controlled carrier signal so as to rotate the phase of digitized I baseband signal and Q baseband signal outputted from the coarse control AFC block 4. Arc tangent of the amplitude of the Q baseband signal whose frequency has been adjusted, divided by the amplitude of the I baseband signal whose frequency has been adjusted is computed so as to generate a phase difference signal, while the I baseband signal whose frequency has been adjusted and Q baseband signal are supplied to the APC block 6. Then, this phase difference signal is differentiated so as to generate a frequency difference signal. Then, to zero this frequency difference signal value, the frequency of the local oscillation signal is adjusted so that the frequency difference signal value is zeroed.

Figure 4:
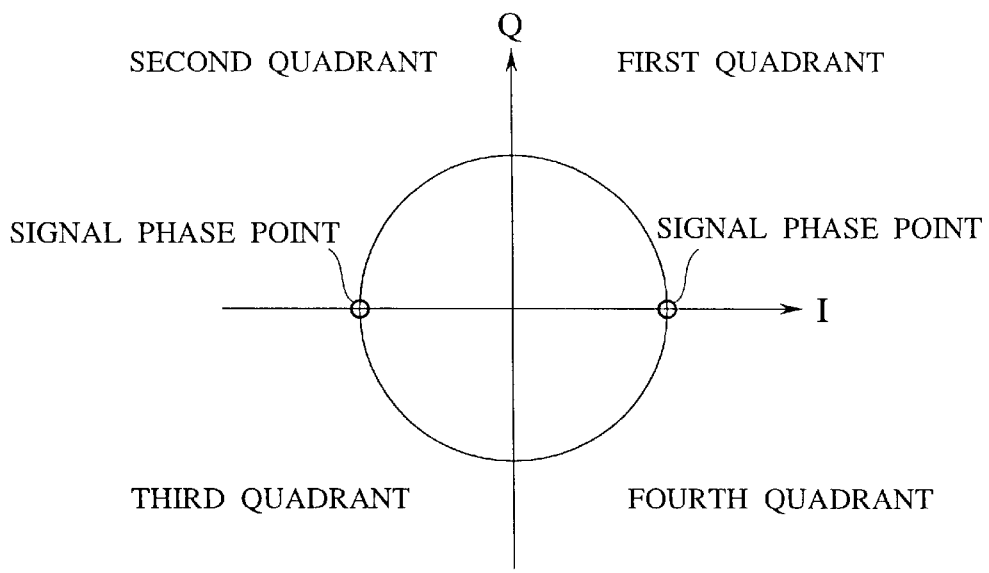
FIG. 4 is a schematic diagram showing an example of relation between the phase of BPSK signal to be inputted into the fine control AFC circuit shown in FIG. 3 and each quadrant.

Because in the digital transmission signal received from this receiver circuit 1, as shown in FIG. 4, the BPSK signal contained in a block is of such a transmission system in which the signal phase value is 0 or 180°. Thus, the second quadrant and third quadrant are turned by 180° so as to overlap them on the fourth and first quadrants, respectively. Accordingly, phase uncertainty due to modulation can be removed. If there is a frequency difference (there is detuning in carrier frequency) between the carrier signal used in generating the digital transmission signal and carrier signal regenerated on the receiver circuit 1 side, the value of the phase error signal observed in this coordinate system increases with a progress of time, so that a phase error signal (phase difference signal) having a waveform shown in FIG. 5 for example, is observed. Then, because the inclination of this phase error signal, that is, a time differential value is proportional to the frequency difference, the detuning frequency is detected by observing this inclination. Accordingly even if the digitized I baseband signal and Q baseband signal to be outputted from the coarse control AFC block 4 contain some extent of the frequency deviation, the frequency deviation of the I baseband signal and Q baseband signal can be zeroed.

The APC block 6 comprises an NCO circuit 20 for generating a local oscillation signal necessary for removing fine frequency error and phase error and changing and fixing the oscillation frequency depending on the value of an inputted phase error signal, a phase control phase rotation circuit 21 for rotating the phase determined by the I baseband signal and Q baseband signal having almost zeroed frequency deviation, outputted from the fine control AFC block 5 according to the local oscillation signal outputted from this NCO circuit 20, a phase detection circuit 22 for computing arc tangent of the amplitude of the BPSK signal of each block contained in the Q baseband signal whose phase has been adjusted, divided by the amplitude of the BPSK signal of each block contained in the I baseband signal whose phase has been adjusted, those signals being outputted from this phase control phase rotation circuit 21, so as to generate the phase error signal, and a filter circuit 23 which removes noise contained in the phase error signal outputted from this phase detection circuit 22, then supplies the signal to the NCO circuit 20 and thus controls the frequency and phase of the local oscillation signal outputted from the NCO circuit 20.

Then, arc tangent of the amplitude of the BPSK signal of each block contained in the Q baseband signal whose frequency deviation has been almost zeroed, divided by the amplitude of the BPSK signal of each block contained in the I baseband signal whose frequency deviation has been almost zeroed, those signals being outputted from the fine control AFC block 5, is computed so as to generate the phase error signal. After that, the noise component of this phase error signal is removed and at the same time, the local oscillation signal is generated so that this phase error signal is zeroed. Then, the phase of the I baseband signal and Q baseband signal whose frequency deviation has been almost zeroed, those signals being outputted from the fine control AFC block 5, is rotated, and the phase and frequency of the local oscillation signal are adjusted so as to zero the value of the phase error signal, and then the phases of the I baseband signal and Q baseband signal whose frequency deviation has been almost zeroed, those signals being outputted from the fine control AFC block 5, are adjusted. Then, the I baseband signal and Q baseband signal whose phase has been adjusted are supplied to the signal decoding portion.

As a result, even if the I baseband signal and Q baseband signal outputted from the fine control AFC block 5 contain minute frequency error, this is detected and a its slight frequency error and slight phase error are corrected so as to establish a complete carrier synchronization.

Figure 6:
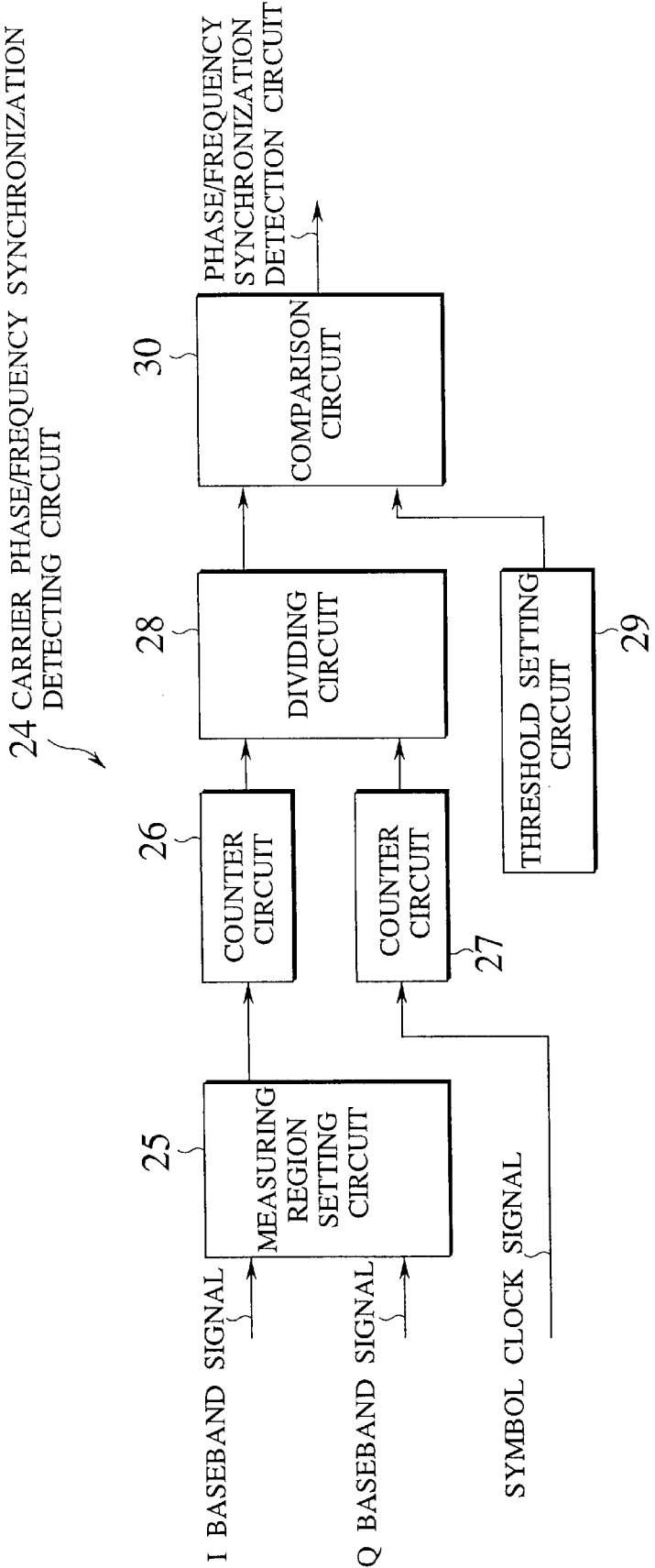
FIG. 6 is a block diagram showing an example of a carrier phase/frequency synchronization detecting circuit for use in the present invention.

If required, a carrier phase/frequency synchronization detecting circuit 24 shown in FIG. 6 is connected to each output terminal of the coarse control AFC block 4, each output terminal of the fine control AFC block 5 or each output terminal of the APC block 6 so as to check whether or not the regenerated carrier signal is locked.

Figure 7:
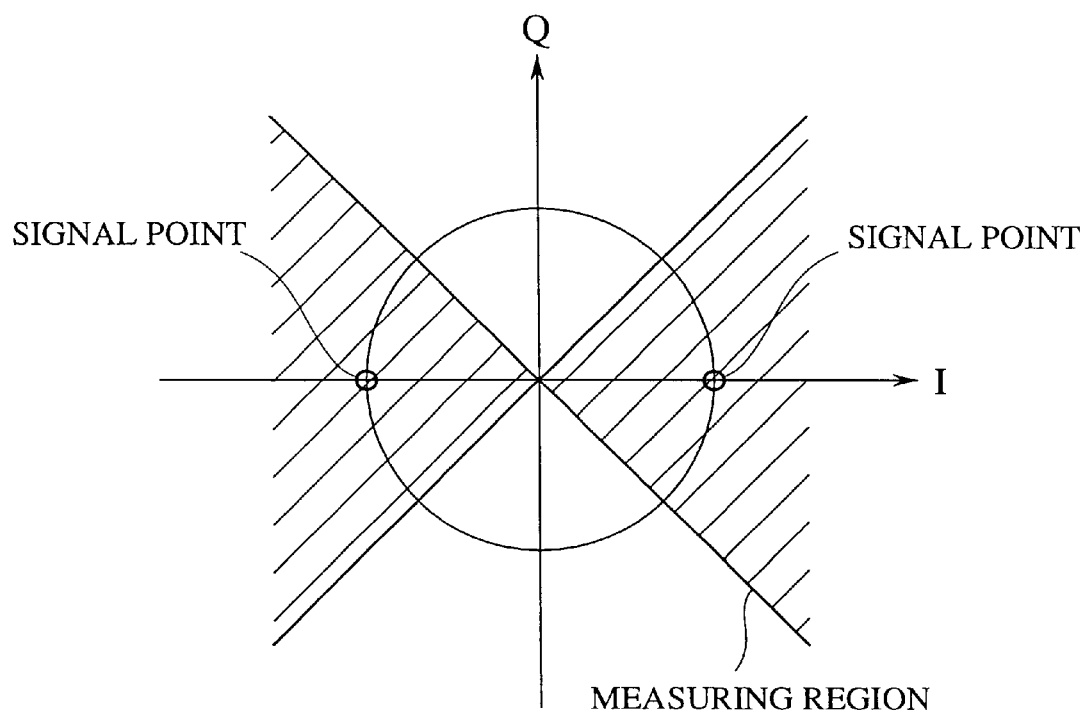
FIG. 7 is a schematic diagram showing a relational example between the phases of I baseband signal and Q baseband signal to be inputted into a measuring region setting circuit shown in FIG. 6 and the measuring region.

The carrier phase/frequency synchronization detecting circuit 24 shown in this Figure comprises a measuring region setting circuit 25 for extracting a pulse signal in a measuring region of a phase plane shown by oblique lines of FIG. 7, of pulse signals in the BPSK modulation period contained in the I baseband signal and Q baseband signal outputted from any of the coarse control AFC block 4, fine control AFC block 5 or APC block 6; a counter circuit 26 for counting a pulse signal outputted from this measuring region setting circuit 25; a counter circuit 27 for counting the number of pulses of symbol clock signal indicating the number of symbols in the BPSK modulation period; a dividing circuit 28 for computing a ratio of a count result of the aforementioned counter circuit 27 as denominator to a count result of the aforementioned counter circuit 26 as numerator so as to obtain a result of division as information saying that data in the BPSK modulation period is received properly; a threshold setting circuit 29 for outputting a threshold for synchronization determination for frequency and phase set preliminarily; and a comparison circuit 30 for comparing the threshold value outputted from this threshold setting circuit 29 with a result of division outputted from the division circuit 28, determining whether or not there is a frequency error in the I baseband signal and Q baseband signal inputted into the measuring region setting circuit 25 according to this comparison result and generating a phase/frequency synchronization detecting signal according to this determination result.

When the input terminal of the measuring region setting circuit 25 is connected to any of each output terminal of the coarse control AFC block 4, each output terminal of the fine control AFC block 5 of each output terminal of the APC block 6 and the I baseband signal and Q baseband signal are outputted from any of the coarse control AFC block 4, the fine control AFC block 5 and APC block 6, a pulse signal within the measuring region is extracted from pulse signals in the BPSK modulation period contained in the I baseband signal and Q baseband signal, the number of pulse signals is counted while the quantity of symbols in the BPSK modulation period is counted, it is determined whether or not there is any frequency error or phase error in the I baseband signal and Q baseband signal inputted into the measuring region setting circuit 25 according to a relation between a ratio of each count result obtained by each counting operation and the threshold value set preliminarily, and a phase/frequency synchronization detecting signal is generated according to this determination result.

If there is a frequency error in the I baseband signal and Q baseband signal inputted into the measuring region setting circuit 25, and the phase of the I and Q baseband signals is rotating, a probability that the pulse signal in the BPSK modulation period exists within the measuring region shown in FIG. 7 is almost equal to a probability that it exists out of the measuring region and a result of division outputted from the division circuit 28 becomes almost 0.5. Thus, it is determined that carrier synchronization has not been established. If the carrier synchronization of the I baseband signal and Q baseband signal inputted into the measuring region setting circuit 25 is established and the phases of the I baseband signal and Q baseband signal are fixed to almost 0 or 180°, the probability that the pulse signal in the BPSK modulation period exists in the measuring region shown in FIG. 7 is 100% and the probability that it exists out of the measuring region is almost 0%. A result of division outputted from the division circuit 28 is almost 1.0. Thus, it is determined that the carrier synchronization has been established.

According to this embodiment, when a digital transmission signal is received by the antenna 2 and the IF signal is outputted from the ODU 3, the IF signal is quadrature-demodulated in the coarse control AFC block 4 so as to generate the I baseband signal and Q baseband signal. Local oscillation frequency sweep is carried out so as to detect the SYNC in a first block contained in the I baseband signal and Q baseband signal from a low frequency side in a range of, for example, 2 MHz so as to regenerate the coarsely controlled carrier signal of the IF signal. At the same time, using the SYNC of the first block and a period of subsequent 176 symbol BPSK signal contained in the I baseband signal and Q baseband signal, a detuning frequency is detected by the fine control AFC block 5 so as to regenerate the fine controlled carrier signals of the I baseband signal and Q baseband signal. Further, according to the BPSK signal of each block of the I baseband signal and Q baseband signal outputted from the fine control AFC block 5, a phase error of the regeneration carrier signal is detected so as to control the phases of the I baseband signal and Q baseband signal by the APC block 6. The I baseband signal and Q baseband signal obtained thereby are supplied to the signal decoding portion. Therefore, when a digitally modulated signal having a reference signal period or digitally modulated signal period having few constellation points for carrier recovery at a predetermined time interval is received, carrier synchronization is carried out using information of phase and frequency errors obtained periodically. As a result, the carrier signal is regenerated stably in a wide capture range so as to regenerate information contained in digitally modulated signal.

Then, carrier recovery having a wide capture characteristic can be achieved even at the time of a low CN. Therefore, in digital satellite broadcasting, use of a cheap frequency converter which has some frequency drift and phase noise is enabled so that the cost of the receiver device can be reduced largely.

Other Embodiments

Although according to the above described embodiment, the circuit employing differential function system shown in FIG. 3 is used as the fine control AFC circuit 14 so as to simplify the hardware structure, it is permissible to achieve the AFC function by analyzing a frequency error by self-correlation function system or count system as well as such differential function system and control the VCO or NCO based on this result of analysis.

Figure 8:
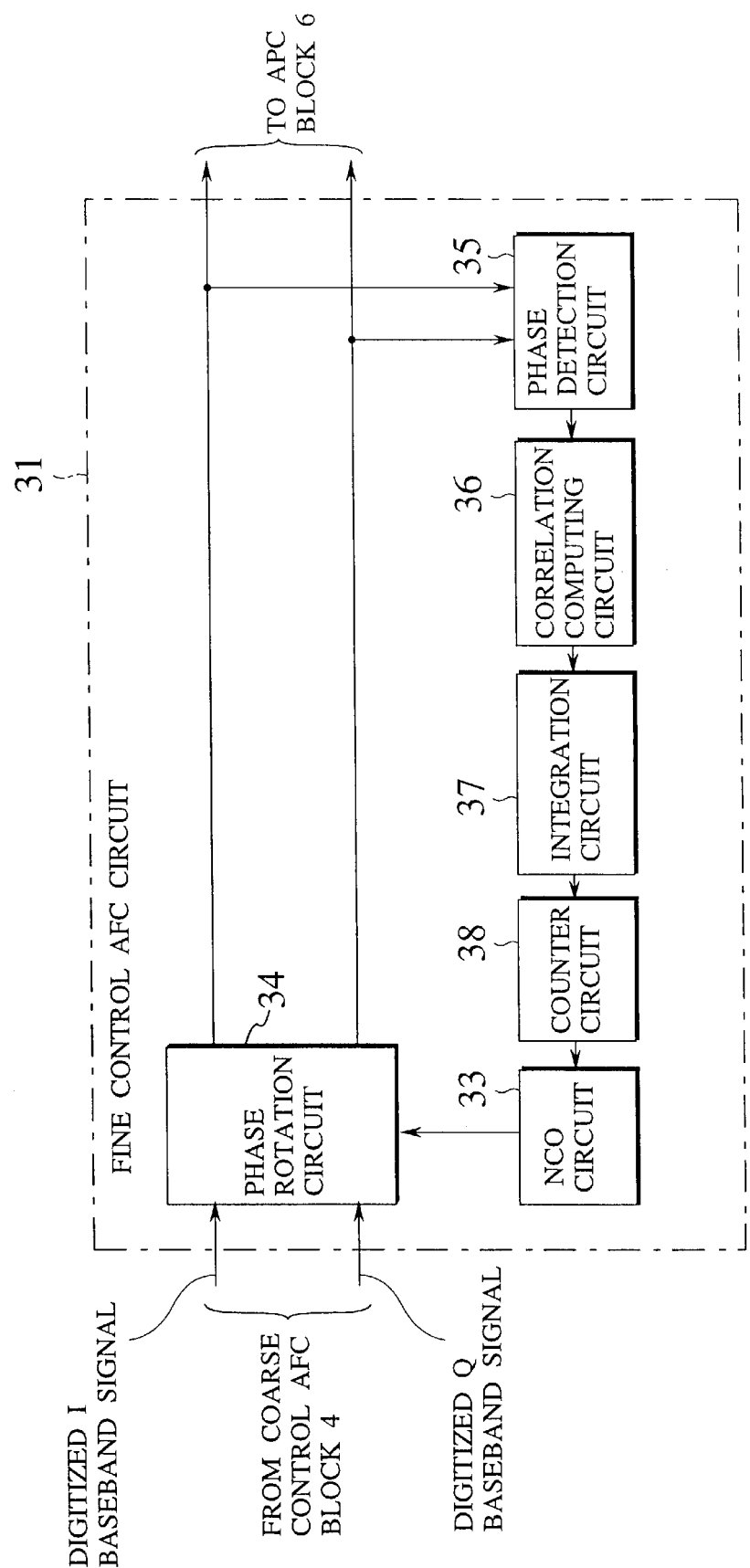
FIG. 8 is a block diagram showing an example of a fine control AFC circuit of autocorrelation function method, of other fine control AFC circuit for use as a fine control AFC circuit shown in FIG. 2.
Figure 9:
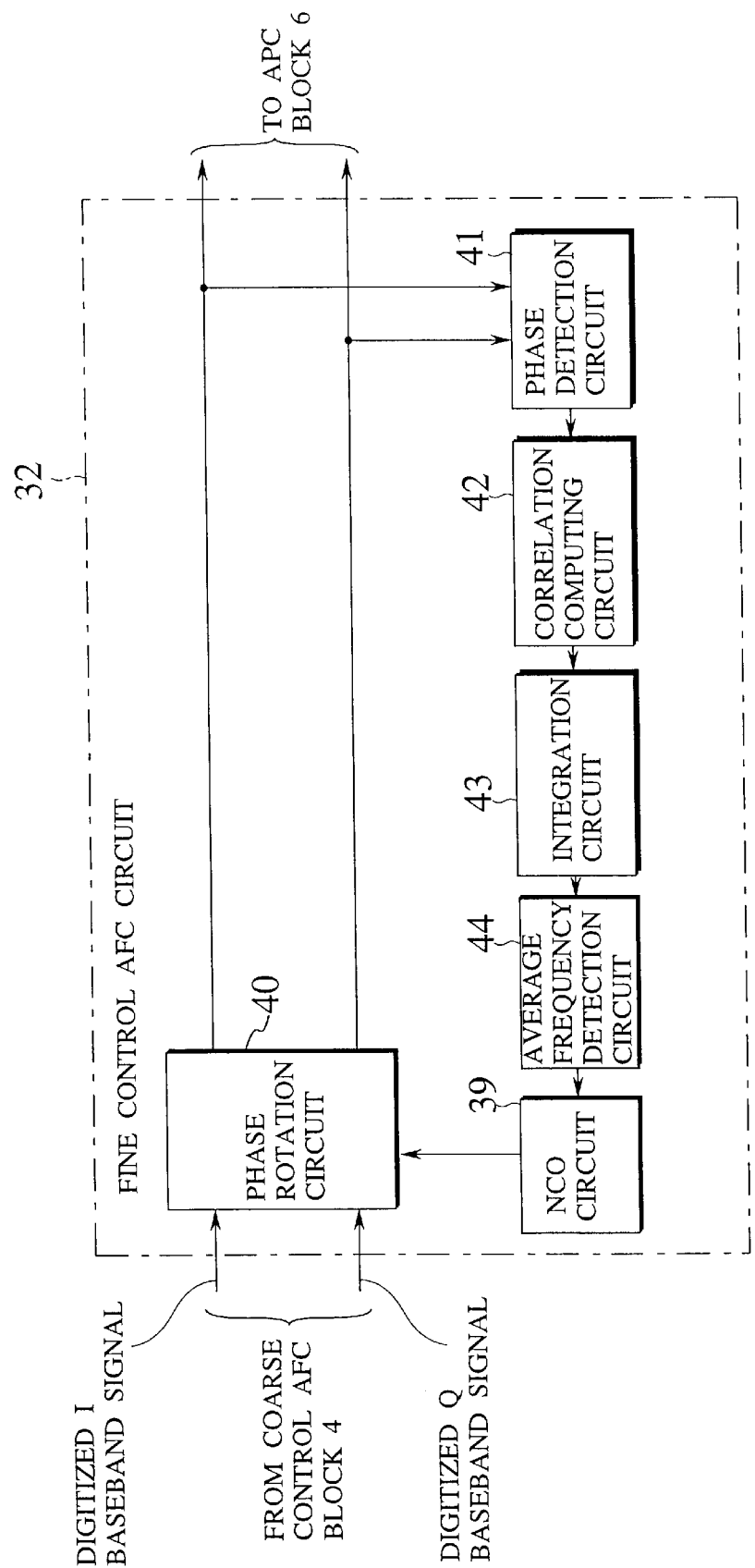
FIG. 9 is a block diagram showing another example of a fine control AFC circuit of auto-correlation function method, of other fine control AFC circuit for use as a fine control AFC circuit shown in FIG. 2.

In this case, when the autocorrelation function type fine control AFC circuit is used as the fine control AFC circuit 14, for example, the fine control AFC circuit 31 shown in FIG. 8 or the fine control AFC circuit 32 shown in FIG. 9 is used.

The fine control AFC circuit 31 shown in FIG. 8 comprises an NCO circuit 33 for generating a local oscillation signal of about 500 kHz lower frequency and changing/fixing the oscillation frequency depending on the inputted frequency difference signal, a phase rotation circuit 34 for rotating the-phases of the digitized I baseband signal and Q baseband signal outputted from the coarse control AFC block 4 according to the local oscillation signal outputted from the NCO circuit 33, a phase detection circuit 35 for computing arc tangent of the amplitude of the Q baseband signal whose phase has been adjusted, divided by the amplitude of the I baseband signal whose phase has been adjusted, those signals being outputted from this phase rotation circuit 34 so as to generate a phase difference signal, a correlation computing circuit 36 for generating a correlation coefficient signal to obtain an autocorrelation coefficient of the phase difference signal outputted from the phase detection circuit 35, an integration circuit 37 for integrating some frames of the correlation coefficient signals outputted from the correlation computing circuit 36, using time series addition method such as average integration method by inter-frame addition so as to reduce an influence of noise, and a counter circuit 38 for counting the number of correlation peaks of the correlation coefficient signal waveform outputted from this integration circuit 37, and generating a frequency difference signal based on this count result so as to control the frequency of a local oscillation signal outputted from the NCO circuit 33.

Then, first of all, a local oscillation signal of, for example, 500 kHz lower frequency is used as the fine controlled carrier signal and the phases of the digitized I baseband signal and Q baseband signal outputted from the coarse control AFC block 4 are rotated. While the I baseband signal and Q baseband signal, whose phases have been adjusted, are supplied to the APC block 6, arc tangent of the amplitude of the Q baseband signal divided by the amplitude of the I baseband signal, whose phases have been adjusted, is computed so as to generate a phase difference signal. After that, self-relation of this phase difference signal is obtained so as to generate a correlation coefficient signal. A number of correlation peaks of this correlation coefficient signal waveform is counted so as to generate a frequency difference signal. Then, the frequency of the local oscillation signal is adjusted so that the value of this frequency difference signal is zeroed. When the frequency difference signal is zeroed, the frequency of the local oscillation signal is fixed.

Figure 5:
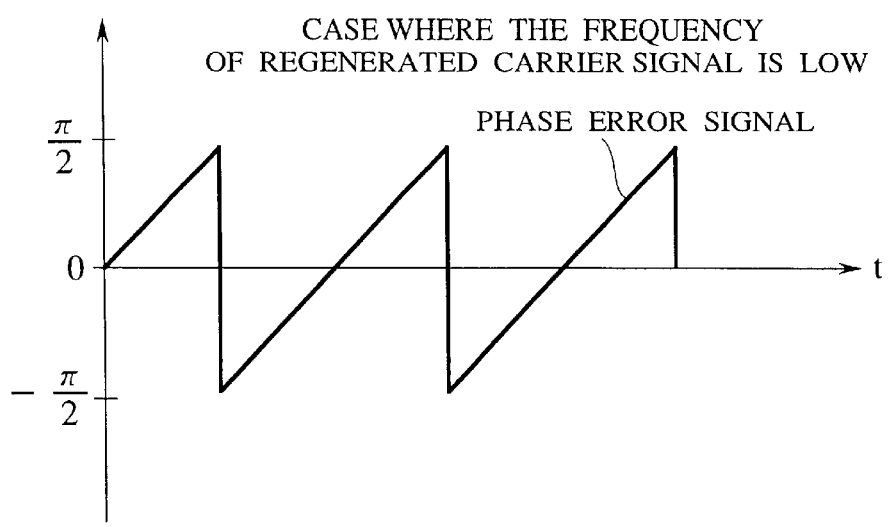
FIG. 5 is a waveform diagram showing an example of a phase error signal outputted from a phase detecting circuit shown in FIG. 3.

If there is a frequency difference between the carrier signal used in generating a digital transmission signal and a carrier signal regenerated on the receiver circuit 1 (if there is detuning in the carrier frequency), the value of a phase error signal observed in the coordinate system shown in FIG. 4 changes with a passage of time, so that a phase error signal having a waveform shown in FIG. 5 is observed. Because the number of correlation peaks appearing in the autocorrelation coefficient waveform of this phase error signal is proportional to the frequency difference, a detuning frequency is detected by observing the autocorrelation coefficient signal of the phase error signal. Even if the digitized I baseband signal and Q baseband signal outputted from the coarse control AFC block 4 includes some extent of frequency deviation, the frequency deviation of the I baseband signal and Q baseband signal can be zeroed.

The fine control AFC circuit 32 shown in FIG. 9 comprises an NCO circuit 39 for generating a local oscillation signal of about 500 kHz lower frequency and changing/fixing the oscillation frequency depending on inputted frequency difference signal; a phase rotation circuit 40 for rotating the phases of the digitized I baseband signal and Q baseband signal outputted from the coarse control AFC block 4 according to the local oscillation signal outputted from this NCO circuit 39; a phase detecting circuit 41 for computing arc tangent of the amplitude of the Q baseband signal divided by the amplitude of the I baseband signal, whose phases have been adjusted, so as to generate a phase difference signal; a correlation computing circuit 42 for obtaining an autocorrelation coefficient of the phase difference signal outputted from this phase detecting circuit 41 so as to generate the correlation coefficient signal; an integration circuit 43 for integrating some frames of the correlation coefficient signal outputted from this correlation computing circuit 42 by using time series addition method such as average integration method by inter-frame addition; and an average period detecting circuit 44 for obtaining an average period of the periodic waveform appearing in the correlation coefficient signal outputted from the integration circuit 43 so as to control the frequency of the local oscillation signal outputted from the NCO circuit 39.

First of all, using the local oscillation signal of, for example, 500 kHz lower frequency as the fine controlled carrier signal, the phases of the digitized I baseband signal and Q baseband signal, those signals being outputted-from the coarse control AFC block 4 are rotated. Then, the I baseband signal and Q baseband signal, whose phases have been adjusted, are supplied to the APC block 6 and arc tangent of the amplitude of the Q baseband signal whose phase has been adjusted, divided by the amplitude of the I baseband signal whose phase has been adjusted is computed so as to generate a phase difference signal. After that, an autocorrelation coefficient of this phase difference signal is obtained and the correlation coefficient signal is generated. At the same time, an average period of the periodic waveform appearing in this correlation coefficient signal is obtained so as to generate a frequency difference signal. The frequency of the local oscillation signal is adjusted so that the value of this frequency difference signal is zeroed. When the value of the frequency difference signal is zeroed, the frequency of the local oscillation signal is fixed.

As the same as the fine control AFC circuit 31 shown in FIG. 8, if there is a frequency difference between the carrier signal used in generating the digital transmission signal and a carrier signal regenerated at the receiver circuit 1 (if there is a detuning in the carrier frequency), the value of an observed phase error signal changes with a passage of time in the coordinate system shown in FIG. 4, so that a phase error signal having a waveform shown in FIG. 5 is observed. The period of a periodic waveform appearing in the autocorrelation coefficient signal of this phase error signal is inversely proportional to the frequency difference, accordingly, by observing this correlation coefficient signal, a detuning frequency is detected. Even if the digitized I baseband signal and Q baseband signal, those signals being outputted from the coarse control AFC block 4, contain some amount of the frequency deviation, the frequency deviation of the I baseband signal and Q baseband signal can be zeroed.

Further, by using such self-correlation function, even if the C/N ratio of a received digital transmission signal is lower, accurate fine controlled carrier signals can be regenerated stably.

In the fine control AFC circuit using count method, the frequency difference is analyzed using the following basic principle, and the VCO or NCO is controlled based on this result of analysis so as to achieve an AFC function having a wide capture range.

Figure 10A:
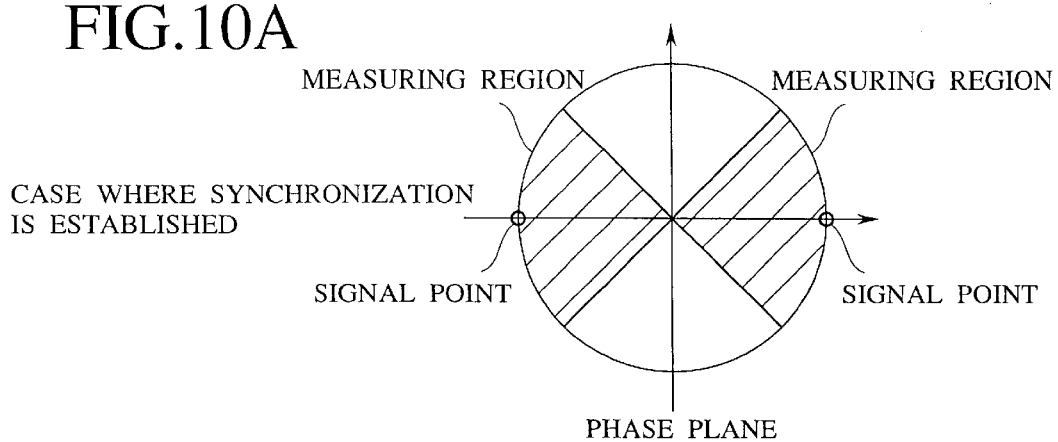
FIGS. 10A–C are schematic diagrams showing a basic principle of the count type fine control AFC circuit, of other fine control AFC circuits for use as a fine control AFC circuit shown in FIG. 2.

If the frequency and phase of the BPSK signal contained in a digital transmission signal are synchronous with the frequency and phase of the regenerated carrier signal, even if noise is contained in the signal, most of signals are observed in a measuring region in signal space indicated by oblique lines of FIG. 10A.

Figure 10B:
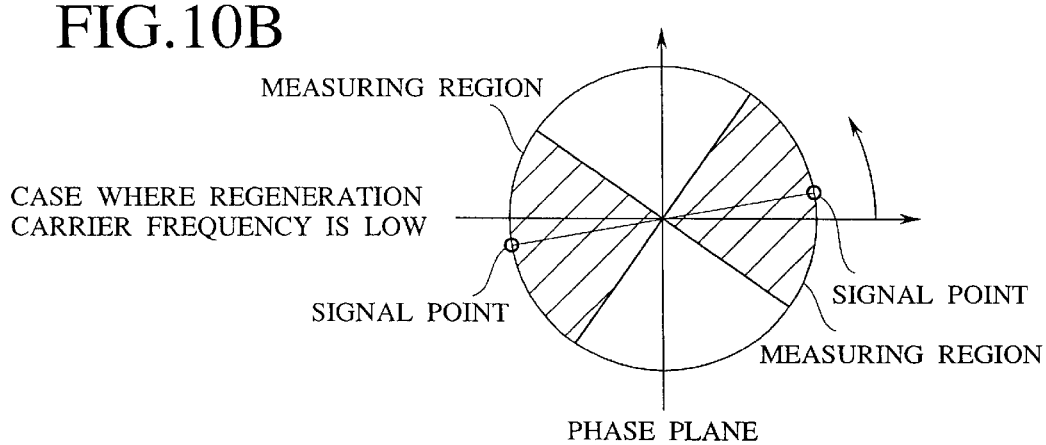
Figure 10C:
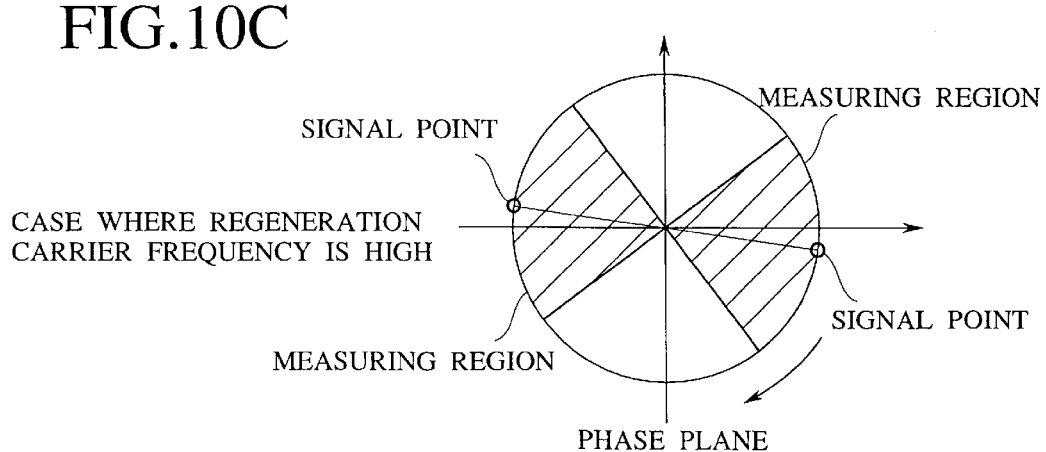

On the other hand, if the frequency of the regenerated carrier signal is deviated, the signal point rotates with a passage of time. At this time, if the frequency of a carrier signal regenerated on the receiver circuit 1 side is lower than the carrier frequency of the BPSK signal contained in the digital transmission signal, by rotating the measuring region indicated by the oblique lines counterclockwise with a passage of time as shown in FIG. 10B, most of signals inputted in the observation period can be counted. On the contrary, if the frequency of the carrier signal regenerated on the receiver circuit 1 side is higher than the carrier frequency of the BPSK signal contained in the digital transmission signal, the measuring region indicated by the oblique lines is rotated clockwise with a passage of time. As a result, most of signals inputted in the observation period can be counted.

At this time, if the rotation speed of the measuring region is made to coincide with an amount of frequency deviation, a count value obtained by the count operation is maximized. Thus, by observing whether or not an inputted signal exists in the plural measuring regions, each of them having individual phase rotation speed and phase offset, the amount of the frequency deviation can be detected.

Figure 11:
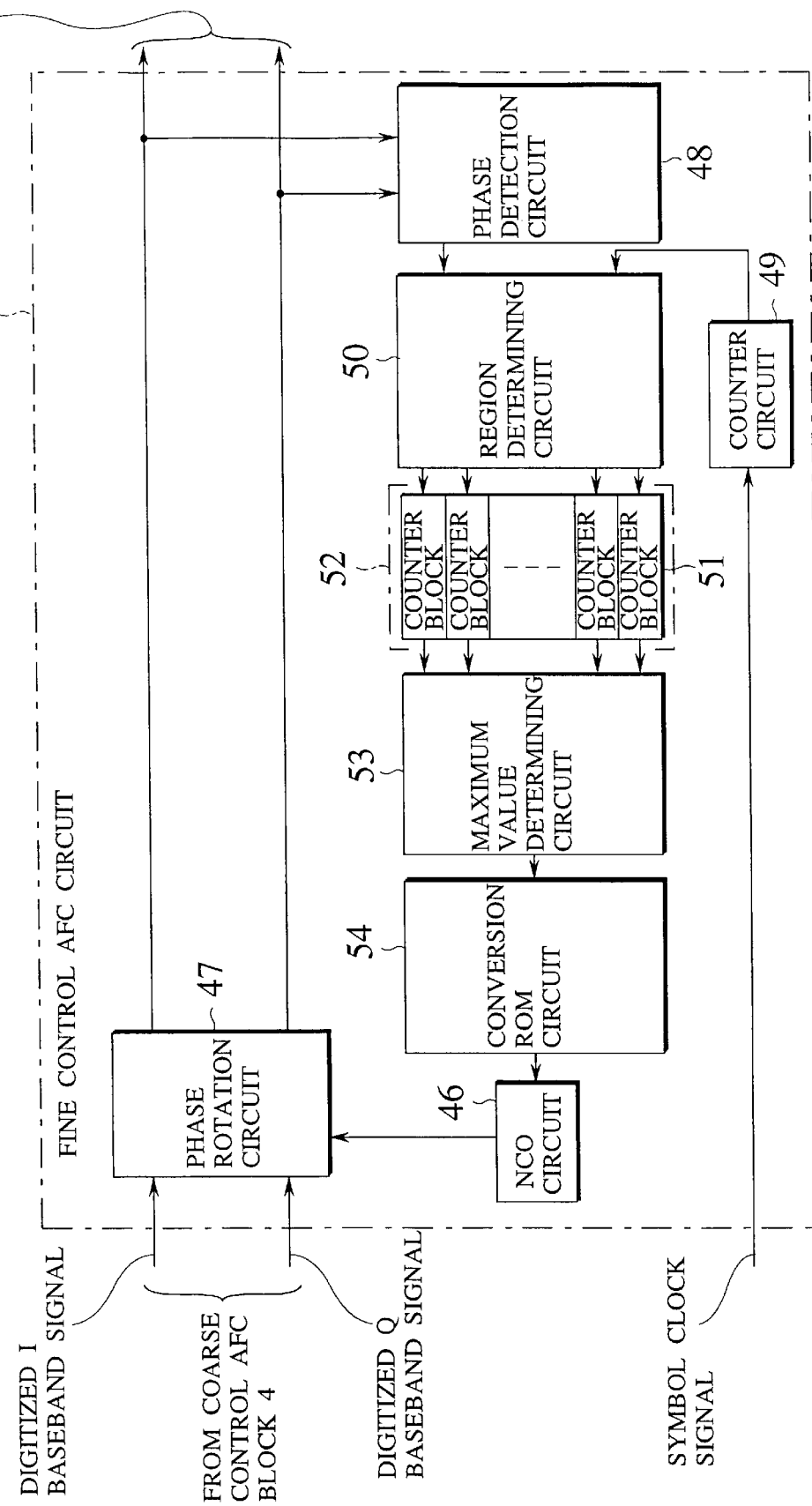
FIG. 11 is a schematic diagram showing an example of the count type fine control AFC circuit, of other fine control AFC circuits for use as a fine control AFC circuit shown in FIG. 2.

FIG. 11 is a block diagram showing an example of a circuit structure of the count type fine control AFC circuit using such a basic principle.

A fine control AFC circuit 45 shown in this Figure comprises an NCO circuit 46 for changing and fixing an oscillation frequency depending on an inputted frequency difference signal; a phase rotation circuit 47 for rotating the phases of the digitized I baseband signal and Q baseband signal, those signals being outputted from the coarse control AFC block 4, according to a local oscillation signal outputted from this NCO circuit 46; a phase detection circuit 48 for computing arc tangent of the amplitude of the Q baseband signal divided by the amplitude of the I baseband signal, those signals being outputted from the phase rotation circuit 47, so as to generate a phase difference signal; a counter circuit 49 for generating a count value (reference time information) necessary for rotating the measuring region by counting the number of symbols contained in the digital transmission signal; and a region determining circuit 50 which has plural groups of the measuring regions, each of group, for example, has 180 pieces of measuring regions which have different phase offset with predetermined angle step, for example, 1°, determines whether or not a phase difference signal outputted from the phase detection circuit 48 is a phase difference signal in the BPSK modulation period based on a count value outputted from the counter circuit 49, and if the phase difference signal is a phase difference signal in the BPSK modulation period, rotates each measuring region at a different rotation speed depending on each group based on a count value so as to determine in which measuring region of 180 the phase difference signal exits and outputs a pulse signal from an output terminal corresponding to an output terminal in which the phase difference signal exists.

The fine control AFC circuit 45 comprises a counter block 52 having a number of counter circuits 51 corresponding to frequency resolution ×phase resolution, for example, 10 groups if for example, a resolution of 1 kHz is provided and an adjustment region of 10 kHz is provided, and if a width of 180° with an interval of 10° is provided, 18 pieces, totaling 180 counter circuits 51 and thereby counting the number of pulse signals outputted from each output terminal of a region determination circuit 50 for each counter circuit 51; a maximum value determining circuit 53 for comparing count values outputted from each of the counter circuits 51 composing the counter block 52 with each other to determine a counter circuit 51 outputting a count value having the largest value and outputting the counter number of this counter circuit 51 and a conversion ROM circuit 54 in which a number (counter number) of each counter circuit 51 and a value of frequency error are registered as a pair and when a counter number is outputted from the maximum value determination circuit 53, a frequency difference signal indicating a frequency error corresponding to this counter number is generated so as to control the frequency of a local oscillation signal outputted from the NCO circuit 46.

Thus, the phases of the digitized I baseband signal and Q baseband signal, outputted from the coarse control AFC block 4 are rotated and the I axis side base block signal and Q baseband signal whose phases have been adjusted are supplied to the APC block 6. At the same time, arc tangent of the amplitude of the Q baseband signal whose phase has been adjusted, divided by the amplitude of the I baseband signal whose phases have been adjusted is computed so as to generate a phase difference signal. After that, determining which measuring region, rotated at a different rotation speed depending on group, this phase difference signal exists in. According to this determination result, each counter circuit 51 is counted up depending on the rotation speed and rotation angle. After that, a frequency difference signal indicating a frequency error corresponding to a circuit number of the counter circuit 51 having the largest value of count values of these counter circuits 51 is generated. The frequency of the local oscillation signal is adjusted so as to zero this frequency difference signal and when the value of the frequency difference signal is zeroed, the frequency of the local oscillation signal is fixed.

Using this arrangement, as the same as the fine control AFC circuits 31, 42 shown in FIGS. 8, 9, when there is a frequency difference between a carrier signal used in generating a digital transmission signal and a carrier signal regenerated on the receiver circuit 1 side (if there is a detuning in regenerated carrier frequency), it is possible to detect this and zero the frequency deviation of the digitized I baseband signal and Q baseband signal, those signals being outputted from the coarse control AFC block 4.

Although in the fine control AFC circuit 14 shown in FIG. 3, fine control AFC circuit 31 shown in FIG. 8, fine control AFC circuit 32 shown in FIG. 9 and fine control AFC circuit 45 shown in FIG. 11, major parts thereof are composed of ROM, it is permissible to use such a device as high speed DSP (digital signal processor) to carry out the above mentioned processing.

By using those devices, the fine control AFC circuits 14, 31, 32, 45 can be made compact.

According to the above embodiments, the frequency deviation and phase deviation of the digitized I baseband signal and Q baseband signal, outputted from the coarse control AFC block 4 are detected by the fine control AFC block 5 and APC block 6 and these are corrected individually so as to eliminate the frequency deviation and phase deviation of the I baseband signal and Q baseband signal. However it is permissible to detect the frequency deviation and phase deviation of the digitized I baseband signal and Q baseband signal, outputted from the coarse control AFC block 4, by the fine control AFC block 5 and APC block 6 and feed back this detection result to a sweep generator circuit 7 of the coarse control AFC block 4 so as to zero the frequency deviation and phase deviation of the digitized I baseband signal and Q baseband signal, outputted from the coarse control AFC block 4.

Also using this arrangement, as the same as the above described embodiments, upon receiving and regenerating a digitally modulated signal provided with reference signal period or digitally modulated signal period having few constellation points for regenerating the carrier at a predetermined time interval, the carrier synchronization is carried out using information about the phase and frequency error obtained periodically and the carrier signal is regenerated stably in a wide capture range so as to regenerate information contained in the digitally modulated signal even when a C/N ratio is low.

Because the carrier recovery having a wide frequency drawing characteristic can be achieved even at the time of a low C/N ratio, use of a cheap frequency converter is enabled although there are some amounts of frequency drift and phase noise, so that cost of the receiver device can be largely reduced in digital satellite broadcasting.

Although in the above described embodiments, each of the fine control AFC circuits 14, 31, 32, 45 is actuated in a modulated signal interval having few constellation points so as to generate the regenerative carrier signal, these fine control AFC circuits 14, 31, 32, 45 may be used in an AFC circuit of a device or system other than the above mentioned receiver circuit 1, for example, an AFC circuit of a transmission system for receiving a transmission signal composed of continuous BPSK signals.

As a result, the inputted modulated signal and carrier signal synchronized in frequency can be regenerated only by actuating these fine control AFC circuits 14, 31, 32, 45.

Figure 12:
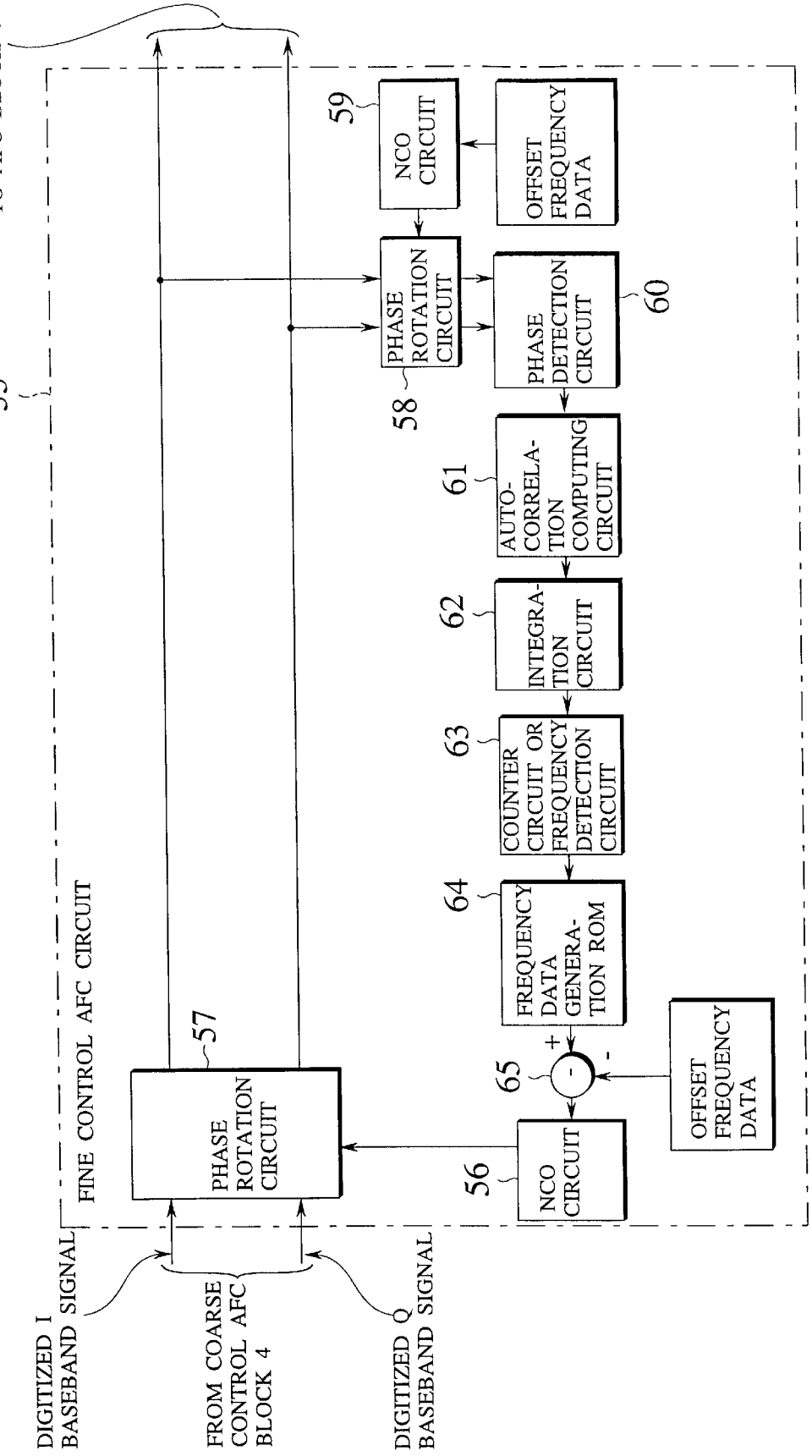
FIG. 12 is a block diagram showing a further example of the fine control AFC circuit of the auto-correlation function type of other fine control AFC circuits for use as a fine control AFC circuit shown in FIG. 2.

FIG. 12 is a block diagram showing still another example of the autocorrelation function type fine control AFC circuit of the fine control AFC circuits for use as the fine control AFC circuit shown in FIG. 2.

This fine control AFC circuit 55 comprises an NCO circuit 56 for generating a local oscillation signal and changing/fixing the oscillation frequency depending on an inputted frequency difference signal; a phase rotation circuit 57 for rotating the phases of the digitized I baseband signal and Q baseband signal outputted from the coarse control AFC block 4 according to the local oscillation signal outputted from this NCO circuit 56; a phase rotation circuit 58 for providing a frequency offset to the rotated I baseband signal and Q baseband signal; an NCO circuit 59 for providing this phase rotation circuit 58 with an local oscillation signal based on the offset frequency data; a phase detection circuit 60 for computing arc tangent of the amplitude of the Q baseband signal divided by the amplitude of the I baseband signal outputted from the phase rotation circuit 58 so as to generate a phase difference signal; an autocorrelation computing circuit 61 for obtaining an autocorrelation coefficient of a phase difference signal outputted from this phase detection circuit 60 so as to generate a correlation coefficient signal; an integration circuit 62 for integrating some frames of the autocorrelation coefficient signals outputted from this self-correlation computing circuit 61 using time series addition method such as average integration method by inter-frame addition so as to reduce the influence of noise; a counter circuit (or period detection circuit for measuring the period of periodic waveform appearing in the autocorrelation coefficient signal) 63 for counting the number of correlation peaks in the autocorrelation coefficient signal outputted from this integration circuit 62; a frequency data generation ROM 64 for generating frequency difference signal (frequency data) corresponding to this count value or period; and a subtraction circuit 65 for subtracting the offset frequency data from the frequency difference signal outputted from this frequency data generation ROM 64 to supply the result to NCO circuit 56. Therefore the fine control AFC circuit 55 provides the I baseband signal and Q baseband signal inputted into the phase detection circuit 60 with frequency offset thereby estimating a detuning frequency lower than a desired frequency even when using the autocorrelation function method in which an absolute value of frequency difference can be measured but the polarity thereof cannot be determined.

In the fine control AFC circuit 55 as described above, upon receiving and regenerating a digitally modulated signal provided with a reference signal period or a digitally modulated signal period having few constellation points to be supplied for carrier recovery at a predetermined time interval, it is possible to reproduce the carrier signal stably using information about the phase and frequency error obtained periodically in a wide capture range even at the time of a low C/N ratio, so as to reproduce information contained in the digitally modulated signal.

According to the above embodiments, the digitally modulated signal period having few constellation points for phase error detection, for use in the APC block, has a length of four symbols and is set for each block. Further, the digitally modulated signal period having few constellation points for frequency error detection, for use in the fine control AFC block, has a length of 196 symbols and is set for each frame. Generally, as for the modulated signal period for frequency error detection, the signal period is set long to raise the accuracy of the detection frequency error while its setting interval may be set long. Contrary, as for the modulated signal period for phase error detection, the setting interval is set narrow to follow a fast phase error fluctuation while the signal period may be set short. However, the length of the signal period and the setting interval of the modulated signal for phase error detection and the modulated signal for frequency error detection, and further whether different modulated signal period are set individually for phase error detection and frequency error detection or are used commonly in the same modulated signal period, depend upon a requested frequency capture range, capture speed, C/N ratio of reception signal, and residual phase error, it is needless to say that a different mode is applied to a different embodiment.

Industrial Applicability

According to each AFC circuit of the present invention, as described above, when the reference signal period or the modulated signal period having few constellation points which can be used for carrier recovery, contained in a input signal, is short or when noise is mixed in the input signal, it is possible to regenerate a carrier signal synchronized with the input signal while suppressing occurrence of false lock.

Further, according to each carrier recovery circuit of the present invention, upon transmitting a modulated signal having different numbers of constellation points by time division method and receiving the signal for regeneration, it is possible to carry out carrier synchronization using information about the phase and frequency error obtained periodically and reproduce the carrier signal stably in a wide capture range, even when the C/N ratio is low.

Further, according to each receiver device of the present invention, upon receiving and reproducing a digitally modulated signal provided with the reference signal period or with digitally modulated signal period having few constellation points to be useful for carrier recovery at a predetermined time interval, it is possible to carry out carrier synchronization using information about the phase and frequency error obtained periodically and reproduce the carrier signal stably in a wide capture range so as to reproduce information contained in digitally modulated signal, even when the C/N ratio is low.

What is claimed is:

1. An AFC circuit for detecting a frequency difference between two inputted signals and zeroing said frequency difference between the inputted signals according, to the detection result, the AFC circuit comprising:
   a correlation computing portion for detecting a phase difference between the inputted signals and computing an autocorrelation coefficient of the phase difference; and
   a frequency difference correcting portion for counting a number of peaks in a waveform of the autocorrelation coefficient obtained by the correlation computing portion and rotating phase of the inputted signals according to the count result so as to zero the frequency difference between the inputted signals.

2. An AFC circuit for detecting a frequency difference between two inputted signals and zeroing said frequency difference between the inputted signals according to the detection result, the AFC circuit comprising:
   a correlation computing portion for detecting a phase difference between the inputted signals and computing an autocorrelation coefficient of a waveform varying in time of the phase difference; and
   a frequency difference correcting portion for obtaining an average period of a periodic waveform appearing in a waveform of the autocorrelation coefficient obtained by the correlation computing portion and rotating a phase between the inputted signals according to the average period so as to zero the frequency difference of the inputted signals.

3. An AFC circuit for detecting a frequency difference between two inputted signals and zeroing said frequency difference between the inputted signals according to the detection result, the AFC circuit comprising:
   a region determining portion for detecting a phase difference between the inputted signals and determining which region each signal point is included in according to the phase difference; and
   a frequency difference correcting portion for counting a determination result of the region determining portion for each phase and for each determining region rotated at a rotation speed corresponding to a set frequency, and rotating phase of the inputted signals according to the count result so as to zero the frequency difference between the inputted signals.

4. A carrier recovery circuit for regenerating a carrier signal from an I baseband signal and a Q baseband signal obtained by quadrature-demodulating a reception signal, the circuit comprising:
   a correlation computing portion for detecting a phase difference between the regenerated carrier signal and the reception signal from the I axis side signal and the Q axis side signal obtained by quadrature-demodulating the reception signal by the regenerated carrier signal so as to compute autocorrelation coefficients of the phase difference; and
   a frequency difference correcting portion for counting a peak in the waveform of the autocorrelation coefficient waveform obtained by the correlation computing portion and controlling a frequency of the regenerated carrier signal according to the count result so as to zero the frequency difference between the reception signal and the regenerated carrier signal.

5. A carrier recovery circuit for regenerating a carrier signal from an I baseband signal and a Q baseband signal obtained by quadrature-demodulating a reception signal, the circuit comprising:
   a correlation computing portion for detecting a phase difference between the regenerated carrier signal and the reception signal from the I baseband signal and the Q baseband signal obtained by quadrature-demodulating the reception signal by the regenerated carrier signal so as to compute autocorrelation coefficients of the phase difference; and
   a frequency difference correcting portion for obtaining an average period of a periodic waveform appearing in a waveform of the autocorrelation coefficient obtained by the correlation computing portion, and controlling a frequency of the regenerated carrier signal based on the average period so as to zero the frequency difference between the reception signal and the regenerated carrier signal.

6. A carrier recovery circuit for regenerating a carrier signal from an I baseband signal and a Q baseband signal obtained by quadrature-demodulating a reception signal, the circuit comprising:

a region determining portion for detecting a phase difference between the regenerated carrier signal and the reception signal from the I axis side signal and the Q axis side signal obtained by quadrature-demodulating the reception signal by the regenerated carrier signal, and determining which region of a phase plane each signal point is included in based on the phase difference; and a frequency difference/phase difference correcting portion for counting a determination result of the region determining portion for each phase and for each determination region rotated at a rotation speed corresponding to a set frequency, and controlling frequency and phase of the regenerated carrier signal based on the count result so as to zero a frequency difference and the phase difference between the reception signal and the regenerated carrier signal.

7. A receiver device for regenerating a carrier signal based on the I baseband signal and the Q baseband signal obtained by quadratured-modulating a reception signal, and decoding the I baseband signal and the Q baseband signal so as to regenerate information, said receiver device further receiving a digitally modulated signal provided with a reference signal period or a digitally modulated signal period having constellation points decreased to observe a phase difference between the reception signal and a regeneration carrier signal with a desired precision within a range of expected reception C/N ratios thereby to obtain the reception signal, the reference signal period or the digital modulation period being used for carrier recovery at a predetermined time interval; and detecting a difference between a regeneration carrier frequency and a carrier frequency of the reception signal obtained in a reference signal period or in a digitally modulated signal period having the constellation points so as to achieve at least one of AFC function or false lock preventing function based on the detection results, wherein an average period of a periodical waveform appearing in an autocorrelation coefficient waveform in a phase variation curve obtained by observing a phase variation in the reference signal period of the reception signal or in the modulation signal period having the constellation points is obtained and then, based on the obtained average period, a detuning frequency is estimated, and then a regeneration carrier frequency is controlled based on detuning frequency. information obtained by the estimation operation, under a state of frequency asynchronization.

8. A receiver device according to claim 7, wherein the regeneration carrier frequency is preliminarily set at a low frequency lower than a desired frequency so as to provide an average period of a periodical waveform or a number of correlation peaks appearing in the autocorrelation coefficient waveform relative to a desired frequency with an offset, thereby making it possible to estimate a detuning frequency lower than the desired frequency.

9. A receiver device according to claim 7, wherein whether or not carrier synchronization is established is detected based on a statistical characteristic of phase points of a signal in a modulation period having constellation points decreased to observe a phase difference between the reception signal and a regeneration carrier signal with a desired precision within a range of expected reception C/N ratios, and oscillation frequency sweep of a local oscillator for use for frequency conversion is stopped based on the detection result.

10. A receiver device for regenerating a carrier signal based on the I baseband signal and the Q baseband signal obtained by quadrature-demodulating a reception signal, and decoding the I baseband signal and the Q baseband signal so as to regenerate information, said receiver device further including a carrier recovery circuit comprising:

a receiving portion for receiving a digitally modulated signal provided with a reference signal period or with a digital modulation period having constellation points decreased to observe a phase difference between the reception signal and a regeneration carrier signal with a desired precision within a range of expected reception C/N ratios thereby to obtain the reception signal, the reference signal period or the digital modulation period being used for carrier recovery at a predetermined time interval;

a region determining portion for detecting a phase difference between the regenerated carrier signal and the reception signal from the I axis side signal and the Q axis side signal obtained by quadrature-demodulating the reception signal by the regenerated carrier signal, and determining which region of a phase plane each signal point is included in based on the phase difference; and a frequency difference/phase difference correcting portion for counting a determination result of the region determining portion for each phase and for each determination region rotated at rotation speed corresponding to a set frequency, and controlling frequency and phase of the regenerated carrier signal based on the count result as to zero a frequency difference and the phase difference between the reception signal and the regenerated carrier signal, whereby at least one of AFC function or false lock preventing function being achieved.

* * * * *